United States Patent
Kim et al.

(10) Patent No.: US 10,573,633 B2
(45) Date of Patent: Feb. 25, 2020

(54) SEMICONDUCTOR DEVICE INCLUDING OVERLAY PATTERNS

(71) Applicant: SAMSUNG ELECTRONICS CO., LTD., Suwon-si, Gyeonggi-Do (KR)

(72) Inventors: Tae Sun Kim, Hwaseong-si (KR); Hyun Jae Kang, Gunpo-si (KR); Tae Hoi Park, Hwaseong-si (KR); Jin Seong Lee, Yongin-si (KR); Eun Sol Choi, Seoul (KR); Min Keun Kwak, Suwon-si (KR); Byung Kap Kim, Suwon-si (KR); Sung Won Choi, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/830,988

(22) Filed: Dec. 4, 2017

(65) Prior Publication Data

US 2018/0175016 A1    Jun. 21, 2018

(30) Foreign Application Priority Data

Dec. 16, 2016 (KR) .................. 10-2016-0173024

(51) Int. Cl.
| | |
|---|---|
| H01L 23/48 | (2006.01) |
| H01L 27/02 | (2006.01) |
| G06F 17/50 | (2006.01) |
| H01L 23/522 | (2006.01) |
| H01L 23/528 | (2006.01) |

(Continued)

(52) U.S. Cl.
CPC ...... *H01L 27/0207* (2013.01); *G03F 7/70633* (2013.01); *G03F 7/70683* (2013.01); *G06F 17/5077* (2013.01); *H01L 23/5226* (2013.01); *H01L 23/5283* (2013.01); *H01L 23/544* (2013.01); *H01L 2223/54426* (2013.01)

(58) Field of Classification Search
CPC ............ H01L 23/5283; H01L 23/5226; H01L 23/544; H01L 27/0207; H01L 2223/54426
See application file for complete search history.

(56) References Cited

U.S. PATENT DOCUMENTS

| | | | |
|---|---|---|---|
| 6,376,899 B1 | 4/2002 | Seshan et al. | |
| 7,408,642 B1 * | 8/2008 | DiBiase | G03F 9/7076 |
| | | | 356/399 |

(Continued)

*Primary Examiner* — Hoa B Trinh
(74) *Attorney, Agent, or Firm* — Volentine, Whitt & Francos, PLLC

(57) ABSTRACT

A semiconductor device includes a first overlay group and a second overlay group disposed on a semiconductor substrate. The first overlay group includes first lower overlay patterns which extend in a first direction, first upper overlay patterns overlapping the first lower overlay patterns, and first via overlay patterns interposed between the first lower overlay patterns and the first upper overlay patterns. The second overlay group includes second lower overlay patterns which extend in a second direction, second upper overlay patterns overlapping the second lower overlay patterns, and second via overlay patterns interposed between the second lower overlay patterns and the second upper overlay patterns. The second lower overlay patterns include end portions adjacent to and spaced apart from the first overlay group.

19 Claims, 18 Drawing Sheets

(51) Int. Cl.
*G03F 7/20* (2006.01)
*H01L 23/544* (2006.01)

(56) References Cited

U.S. PATENT DOCUMENTS

| | | | |
|---|---|---|---|
| 7,939,445 B1* | 5/2011 | Sutardja | H01L 21/76838 |
| | | | 257/E21.575 |
| 7,998,827 B2 | 8/2011 | Hatano | |
| 8,546,962 B2 | 10/2013 | Huang et al. | |
| 8,742,547 B2* | 6/2014 | Yoshizawa | H01L 23/585 |
| | | | 257/620 |
| 9,202,788 B2 | 12/2015 | Okuno et al. | |
| 9,245,796 B1 | 1/2016 | Ban et al. | |
| 9,305,886 B2 | 4/2016 | Shao et al. | |
| 2014/0070416 A1 | 3/2014 | Lu et al. | |
| 2014/0264700 A1* | 9/2014 | Janson | G01S 3/7861 |
| | | | 257/435 |
| 2014/0320627 A1* | 10/2014 | Miyamoto | G03F 7/70633 |
| | | | 348/80 |
| 2014/0375793 A1 | 12/2014 | Harada et al. | |
| 2015/0011022 A1 | 1/2015 | Lee et al. | |
| 2015/0055125 A1 | 2/2015 | Tzai et al. | |
| 2015/0076613 A1* | 3/2015 | Chen | G03F 7/70633 |
| | | | 257/368 |
| 2016/0025484 A1* | 1/2016 | Kim | G03F 7/70633 |
| | | | 356/614 |
| 2016/0211213 A1 | 7/2016 | Lin et al. | |

\* cited by examiner

SEMICONDUCTOR DEVICE INCLUDING OVERLAY PATTERNS

CROSS-REFERENCE TO RELATED APPLICATION

A claim for priority under 35 U.S.C. § 119 is made to Korean Patent Application No. 10-2016-0173024, filed on Dec. 16, 2016 in the Korean Intellectual Property Office, the disclosure of which is incorporated herein in its entirety by reference.

BACKGROUND

The inventive concepts described herein relate to a semiconductor device including overlay patterns.

A vertical alignment of an upper pattern and a lower pattern disposed on a semiconductor substrate may be referred to as an overlay. In order to prevent the occurrence of defects caused by misalignment of a lower pattern and an upper pattern, an overlay there between may be measured, using an optical overlay measuring device.

SUMMARY

Embodiments of the inventive concept provide a semiconductor device including overlay patterns that reduce defects caused by misalignment among a plurality of layers.

Embodiments of the inventive concept provide a method of measuring an overlay using different overlay measuring devices.

Embodiments of the inventive concept provide a method of forming a semiconductor device using different overlay measuring devices.

Embodiments of the inventive concept provide a semiconductor device that includes a first overlay group disposed on a semiconductor substrate; and a second overlay group disposed on the substrate, adjacent to and spaced apart from the first overlay group. The first overlay group includes first lower overlay patterns which extend in a first direction, first upper overlay patterns overlapping the first lower overlay patterns, and first via overlay patterns interposed between the first lower overlay patterns and the first upper overlay patterns. The first upper overlay patterns are wider than the first lower overlay patterns, and the first via overlay patterns are narrower than the first lower overlay patterns. The second overlay group includes second lower overlay patterns which extend in a second direction, second upper overlay patterns overlapping the second lower overlay patterns, and second via overlay patterns interposed between the second lower overlay patterns and the second upper overlay patterns. The second upper overlay patterns are wider than the second lower overlay patterns, and the second via overlay patterns are narrower than the second lower overlay patterns. The second lower overlay patterns include end portions disposed to be adjacent to and spaced apart from the first overlay group.

Embodiments of the inventive concept further provide a semiconductor device that includes a first via overlay pattern and a second via overlay pattern disposed over a semiconductor substrate, the first and second via overlay patterns being spaced apart from and coplanar with each other. A first lower overlay pattern is interposed between the first via overlay pattern and the semiconductor substrate. The first lower overlay pattern is wider than the first via overlay pattern. A second lower overlay pattern is interposed between the second via overlay pattern and the semiconductor substrate. The second lower overlay pattern is wider than the second via overlay pattern. A first upper overlay pattern is disposed on the first via overlay pattern. The first upper overlay pattern overlaps the first lower overlay pattern, and is wider than the first lower overlay pattern. A second upper overlay pattern is disposed on the second via overlay pattern. The second upper overlay pattern overlaps the second lower overlay pattern, and is wider than the second lower overlay pattern. An overlay shift of the first via overlay pattern with respect to the first lower overlay pattern is greater than an overlay shift of the second via overlay pattern with respect to the second lower overlay pattern.

Embodiments of the inventive concept still further provide a semiconductor device that includes a first structure extending in a first direction, and a second overlay structure extending in a second direction perpendicular to the first direction. The first overlay structure includes a first lower overlay pattern disposed over a semiconductor substrate; a first upper overlay pattern overlapping the first lower overlay pattern, the first upper overlay pattern wider than the first lower overlay pattern; and a first via overlay pattern interposed between the first lower overlay pattern and the first upper overlay pattern, and connecting the first lower overlay pattern and the first upper overlay pattern to each other. The second overlay structure includes a second lower overlay pattern disposed over the semiconductor substrate; a second upper overlay pattern overlapping the second lower overlay pattern, the second upper overlay pattern wider than the second lower overlay pattern; and a second via overlay pattern interposed between the second lower overlay pattern and the second upper overlay pattern, and connecting the second lower overlay pattern and the second upper overlay pattern to each other.

BRIEF DESCRIPTION OF DRAWINGS

The above and other aspects, features and other advantages of the inventive concepts will be more clearly understood from the following detailed description when taken in conjunction with the accompanying drawings, in which.

DETAILED DESCRIPTION

As is traditional in the field of the inventive concepts, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the inventive concepts. Likewise, the blocks of the embodiments may be physically combined into more complex blocks without departing from the scope of the inventive concepts.

Figure 1:
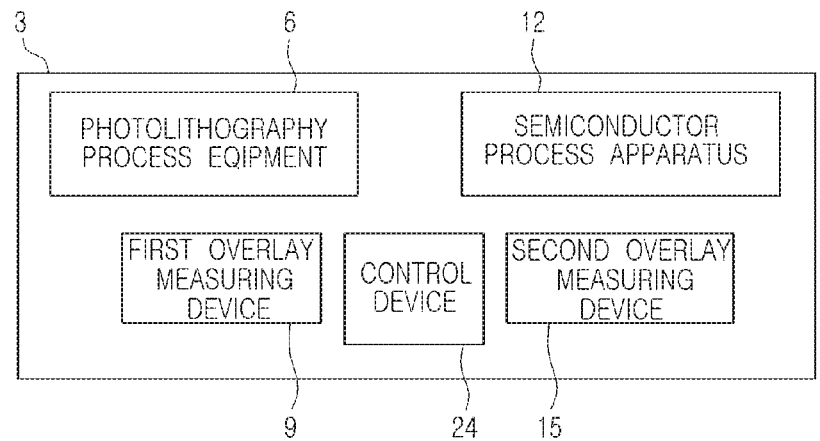
FIG. 1 illustrates a block diagram of a processing system used to form semiconductor devices according to example embodiments of the inventive concept.

With reference to FIG. 1, an example of a processing system which may be used to manufacture semiconductor devices according to example embodiments will be described.

FIG. 1 illustrates a block diagram of a processing system used to form semiconductor devices according to example embodiments of the inventive concept.

With reference to FIG. 1, semiconductor processing system 3 includes photolithography process equipment 6 configured to perform photolithography processes, a first overlay measuring device 9 configured to measure a first overlay using a photoresist pattern formed using the photolithography process equipment 6, a semiconductor process apparatus 12 configured to perform subsequent processing using the photoresist pattern formed by photolithography process equipment 6, and a second overlay measuring device 15 configured to measure a second overlay using a second overlay pattern formed using the semiconductor process apparatus 12. In addition, the semiconductor processing system 3 may include a control device 24 configured to transmit and receive signals (not shown) to/from the first overlay measuring device 9 and the second overlay measuring device 15.

Figure 2:
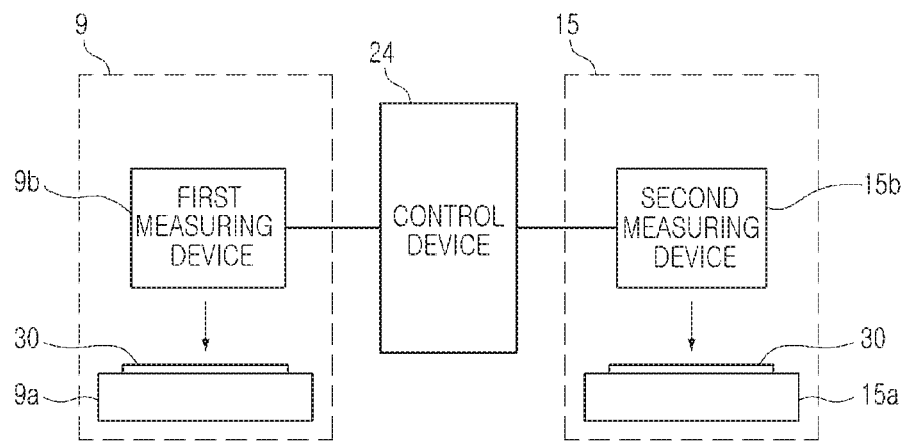
FIG. 2 illustrates a block diagram of an overlay measuring apparatus and a control device such as shown in FIG. 1, according to example embodiments of the inventive concept.

Descriptions of the first overlay measuring device 9, the second overlay measuring device 15, and the control device 24 will be provided with reference to FIG. 2.

FIG. 2 illustrates a block diagram of an overlay measuring apparatus (e.g., the first overlay measuring device 9 and the second overlay measuring device 15) and the control device 24 such as shown in FIG. 1, according to example embodiments of the inventive concept.

With reference to FIG. 1 and FIG. 2, the first overlay measuring device 9 includes for example a first tray 9a on which a semiconductor substrate 30 may be disposed. The semiconductor substrate 30 may have a photoresist pattern formed thereon by the photolithography process equipment 6. The first overlay measuring device 9 further includes a first measuring device 9b configured to measure an overlay using the photoresist pattern. For example, the first measuring device 9b may measure an overlay of overlaid object patterns using diffraction or light. The control device 24 may be configured to generate overlay error data indicative of misalignment of the overlaid object patterns using data measured and obtained by the first measuring device 9b. The overlay error data generated using the method described above may be fed back to the photolithography process equipment 6.

The second overlay measuring device 15 includes for example a second tray 15a on which the semiconductor substrate 30 may be disposed. At this point, the semiconductor substrate 30 may include a metallic overlay pattern formed thereon by the semiconductor process apparatus 12. The metallic overlay pattern may be formed using a photoresist pattern formed by the photolithography process equipment 6. The second overlay measuring device 15 further includes a second measuring device 15b configured to measure an overlay using the metallic overlay pattern. For example, the second measuring device 15b may be provided as a measurement device using a scanning electron microscope (SEM). For example, the second measuring device 15b may scan an electron beam having a landing energy for example greater than or equal to about 10 keV on semiconductor substrate 30, thereby extracting an SEM image of metallic patterns stacked in an amount of at least three layers. The control device 24 may generate the overlay error data using the SEM image extracted by the second overlay measuring device 15. The overlay error data generated using the method described above may be fed back to the photolithography process equipment 6.

According to example embodiments of the inventive concept, the semiconductor processing system 3 including the first overlay measuring device 9 and the second overlay measuring device 15 may measure an overlay using different methods. Since the first overlay measuring device 9 measures overlay using the photoresist pattern, relatively fast feedback is provided. In addition, since the second overlay measuring device 15 measures overlay using metallic patterns similar to an actual circuit pattern, a misalignment value similar to that of the actual circuit pattern may be extracted. Thus, overlay matching may be improved. In the case of a semiconductor device formed using the semiconductor processing system 3 according to embodiments of the inventive concept, defects caused by misalignment of various formed patterns may be reduced. The semiconductor processing system 3 may improve productivity.

The semiconductor substrate 30 disposed on the first tray 9a of the first overlay measuring device 9 and on the second tray 15a of the second overlay measuring device 15 will be described with reference to FIGS. 3 and 4.

Figure 3:
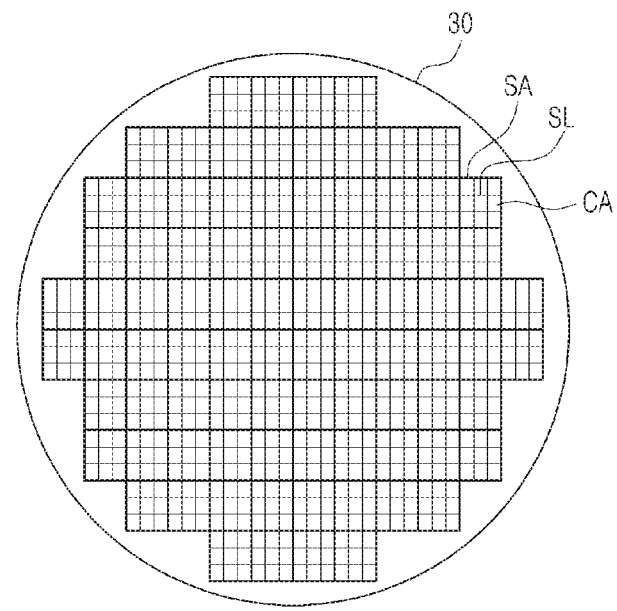
FIG. 3 illustrates a top view of a semiconductor substrate used to form a semiconductor device according to example embodiments of the inventive concept.

FIG. 3 illustrates a top view of a semiconductor substrate used to form a semiconductor device according to example embodiments of the inventive concept. FIG. 4 illustrates a partially enlarged view of FIG. 3.

Figure 4:
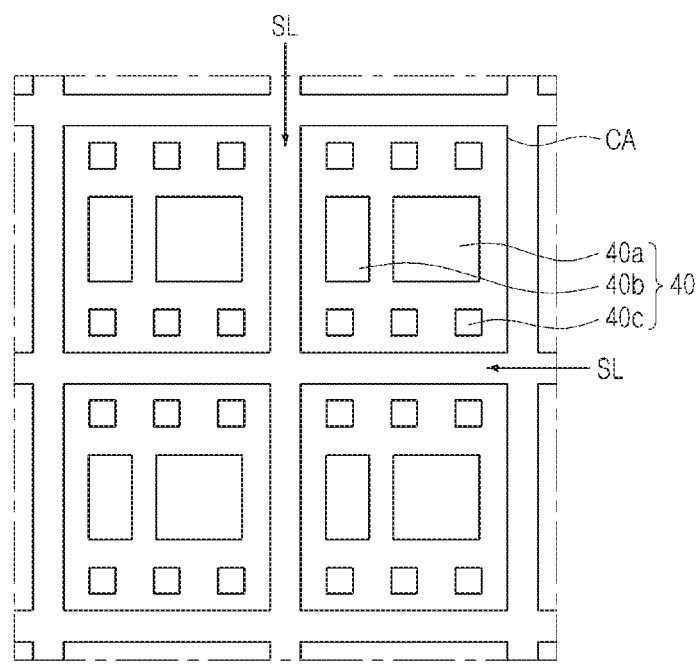
FIG. 4 illustrates a partially enlarged view of FIG. 3.

With reference to FIGS. 3 and 4, the semiconductor substrate 30 may include a plurality of shot areas SA. Each of the shot areas SA may refer to an area exposed by a single exposure process. A single shot area may include a single chip area or a plurality of chip areas CA. A scribe lane area SL may be interposed between the chip areas CA. Each of the chip areas CA may include a plurality of circuit areas 40. The plurality of circuit areas 40 may include for example a logic circuit area 40a, a memory area 40b, and an input/output device area 40c, among other possible areas.

Subsequently, examples of an overlay mark used in a first overlay measuring device 9 and overlay patterns used in a second overlay measuring device 15 will be described.

Figure 5:
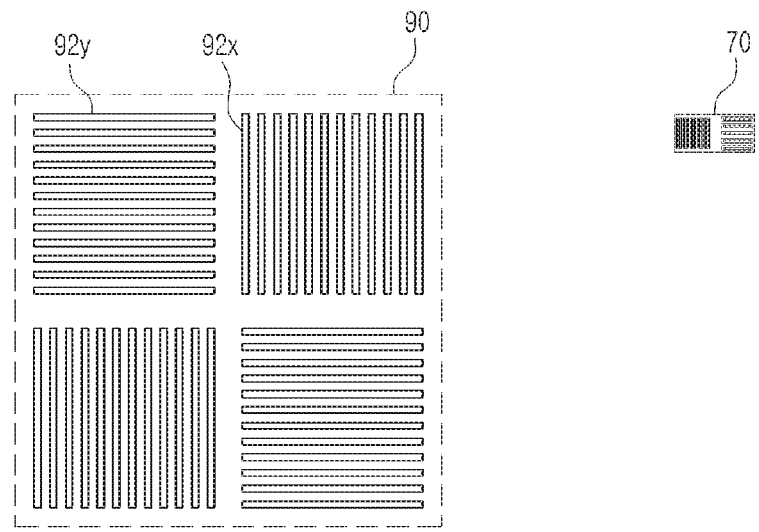
FIG. 5 illustrates a top view of overlay patterns of a semiconductor device according to example embodiments of the inventive concept.

FIG. 5 illustrates a top view of overlay patterns of a semiconductor device according to example embodiments of the inventive concept.

With reference to FIG. 5, the semiconductor device according to example embodiments may include overlay patterns formed in a first overlay area 70, and overlay marks 92x and 92y formed in a second overlay area 90.

The second overlay area 90 may be provided as an area measuring an overlay using the first overlay measuring device 9 described in FIGS. 1 and 2. For example, a photoresist pattern may be formed on the second overlay area 90 by performing a photolithography process. Before a subsequent process (e.g., an etching process) is performed, overlay measurement using the first overlay measuring device 9 (FIG. 2) using the photoresist pattern formed on the second overlay area 90 may be performed. The second overlay area 90 may be referred to as a photolithography overlay area. The second overlay area 90 may include first overlay marks 92x prolonged or extended in a first direction D1, and may include second overlay marks 92y prolonged or extended in a second direction D2 which is perpendicular to the first direction D1.

The first overlay area 70 may be provided as an area measuring an overlay using the second overlay measuring device 15 described in FIGS. 1 and 2. The first overlay area 70 may be smaller than the second overlay area 90. When viewed from above, the first overlay area 70 may have an area smaller than that of the second overlay area 90. The overlay patterns formed in the first overlay area 70 may be formed to have a size or a width less than that of the overlay marks 92x and 92y formed in the second overlay area 90.

According to example embodiments, the second overlay area 90 used for measuring an overlay using the photoresist pattern, and the first overlay area 70 used for measuring an overlay using an overlay structure including metallic patterns stacked in an amount of at least three layers, may be provided.

Hereinafter, examples of the overlay structure including the metallic patterns stacked in an amount of at least three layers formed in the first overlay area 70 will be described.

Figure 6:
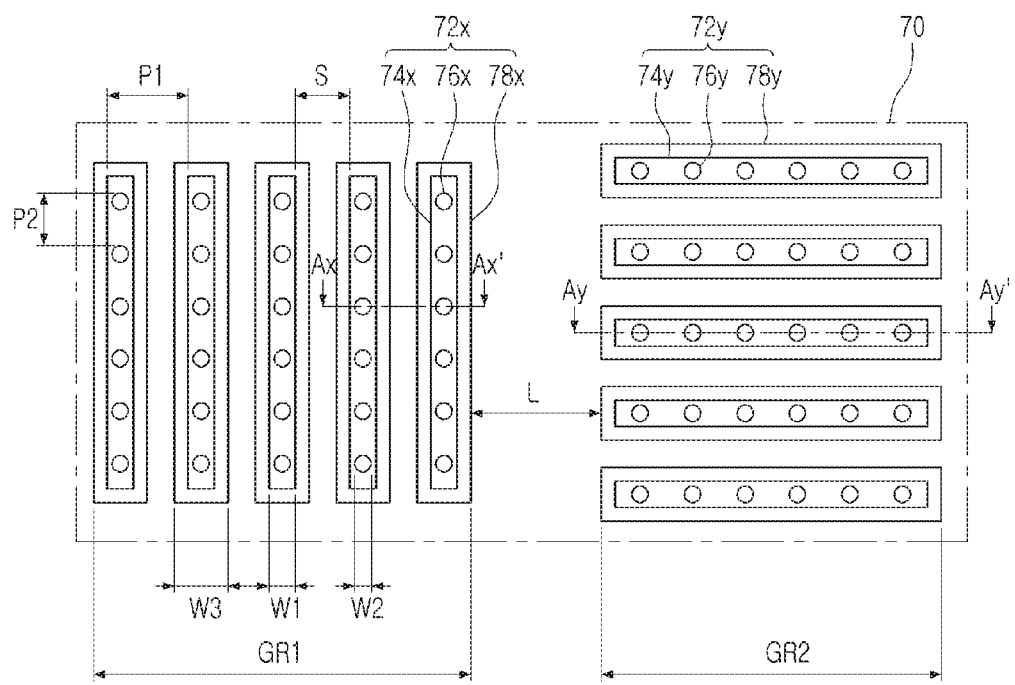
FIG. 6 illustrates a top view of an overlay structure in a first overlay area of a semiconductor device according to example embodiments of the inventive concept.
Figure 7A:
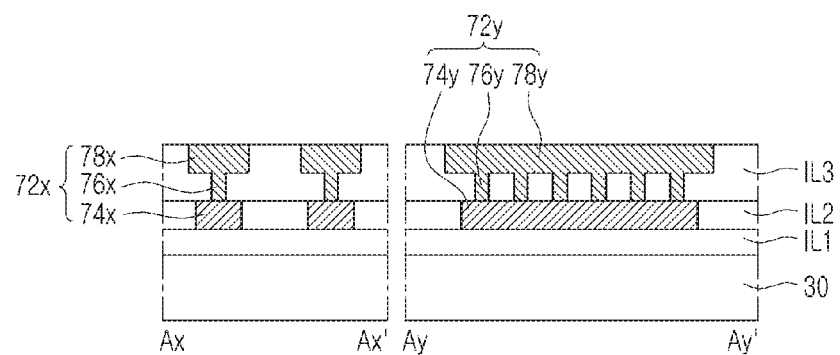
FIG. 7A illustrates cross-sectional views of the overlay structure in a first overlay area shown in FIG. 6.
Figure 7B:
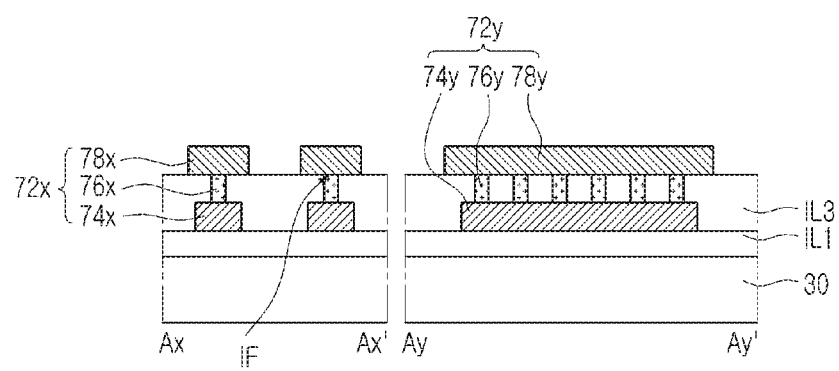
FIG. 7B illustrates cross-sectional views of a modified overlay structure usable in a first overlay area shown in FIG. 6.

FIG. 6 illustrates a top view of an overlay structure in a first overlay area 70 of a semiconductor device. FIG. 7A illustrates cross-sectional views of the overlay structure in the first overlay area 70 shown in FIG. 6. FIG. 7B illustrates cross-sectional views of a modified overlay structure usable in the first overlay area 70 shown in FIG. 6. FIGS. 7A and 7B are cross-sectional views taken along line Ax-Ax' and line Ay-Ay' of FIG. 6.

With reference to FIGS. 6 and 7A, the first overlay area 70 of a semiconductor substrate 30 may include for example a first overlay group GR1 and a second overlay group GR2, disposed to be adjacent to and spaced apart from each other. The first overlay group GR1 and the second overlay group GR2 may be formed using overlay patterns formed using a conductive material such as for example a metallic material. Also, each of the first overlay group GR1 and the second overlay group GR2 may be electrically isolated from each other. In example embodiments, a conductive material pattern is not interposed between the first overlay group GR1 and the second overlay group GR2. A conductive material pattern is not interposed between the semiconductor substrate 30 and the first overlay group GR1, and is not interposed between the semiconductor substrate 30 and the second overlay group GR2. Thus, a conductive material pattern, which may have an adverse effect on overlay measurement, is not interposed between the first overlay group GR1 and the second overlay group GR2, is not interposed between the semiconductor substrate 30 and the first overlay group GR1, and is not interposed between the semiconductor substrate 30 and the second overlay group GR2.

The first overlay group GR1 may include first overlay structures 72x, while the second overlay group GR2 may include second overlay structures 72y. When viewed from above, the second overlay structures 72y may be formed by rotating the first overlay structures 72x through 90 degrees. Thus, since the second overlay structures 72y may be construed as a structure in which the first overlay structures 72x are rotated through 90 degrees, detailed description of the second overlay structures 72y will hereinafter be omitted.

The first overlay structures 72x may include first lower overlay patterns 74x, first via overlay patterns 76x, and first upper overlay patterns 78x. The second overlay structures 72y may include second lower overlay patterns 74y, second via overlay patterns 76y, and second upper overlay patterns 78y.

The first lower overlay patterns 74x may be disposed parallel with respect to each other, and may be elongated or extended in a first direction D1. The second lower overlay patterns 74y may be disposed parallel with respect to each other, and may be elongated or extended in a second direction D2 perpendicular to the first direction D1. The first lower overlay patterns 74x and the second lower overlay patterns 74y may be bar-shaped or formed in a linear manner.

First lower overlay patterns disposed adjacent to each other among the first lower overlay patterns 74x may be disposed to be spaced apart from each other by a first distance S. Each of the first lower overlay patterns 74x may have a first width W1. The first lower overlay patterns 74x may be arranged at a first pitch P1. In example embodiments, the first pitch P1 may be a sum of the first distance S and the first width W1. The first distance S may be greater than the first width W1. A distance L between the first overlay group GR1 and the second overlay group GR2 may be greater than the first pitch P1. In detail, the distance L between the first overlay group GR1 and the second overlay group GR2 may be greater than a sum of the distance S between the first lower overlay patterns 74x and the first width W1 of each of the first lower overlay patterns 74x. A distance between a side surface of a first lower overlay pattern 74x disposed to be most adjacent to the second lower overlay patterns 74y and end portions of the second lower overlay patterns 74y may be greater than the sum of the first distance S and the first width W1. The first pitch P1, the first distance S, the distance L and the distance between a side surface of a first lower overlay pattern 74x and end portions of the second lower overlay patterns 74y are not limited to the above noted values, and in other example embodiments may be different than the examples described above.

The first lower overlay patterns 74x and the second lower overlay patterns 74y may be disposed on the semiconductor substrate 30. A space between the first lower overlay pattern 74x and the semiconductor substrate 30, and between the second lower overlay patterns 74y and the semiconductor substrate 30, may be filled with an insulating structure IL1. The (first) insulating structure IL1 does not include a metallic pattern, so as to avoid causing an error in overlay measurement. A space between the first lower overlay patterns 74x and the second lower overlay patterns 74y may be filled with a (second) insulating layer IL2.

The first upper overlay patterns 78x, overlapping the first lower overlay patterns 74x, may be disposed over the first lower overlay patterns 74x. The first upper overlay patterns 78x may be elongated or extended in the first direction D1. The second upper overlay patterns 78y, overlapping the second lower overlay patterns 74y, may be disposed over the second lower overlay patterns 74y. The second upper overlay patterns 78y may be elongated or extended in the second direction D2.

In an example embodiment, the first upper overlay pattern 78x may entirely covers the first lower overlay pattern 74x in a plan view. The second upper overlay pattern 78y entirely covers the second lower overlay pattern 84y in a plan view.

A plurality of first via overlay patterns 76x may be interposed between the first lower overlay patterns 74x and the first upper overlay patterns 78x. The first via overlay patterns 76x may be arranged with respect to each other at a second pitch P2 along the first direction D1. A distance between the first via overlay patterns 76x may be greater than a width W2 of the first via overlay patterns 76x. In order to measure an overlay more accurately, the plurality of first via overlay patterns 76x may be interposed between a single first lower overlay pattern 74x and a single first upper overlay pattern 78x. A plurality of second via overlay patterns 76y may be interposed between the second lower overlay patterns 74y and the second upper overlay patterns 78y. The plurality of second via overlay patterns 76y may be interposed between a single second lower overlay pattern 74y and a single second upper overlay pattern 78y.

In an example embodiment, when viewed from above, each of the first via overlay patterns 76x and the second via overlay patterns 76y may for example be circular. In a case in which the first via overlay patterns 76x and the second via overlay patterns 76y are circular when viewed from above, the width W2 of each of the first via overlay patterns 76x and the second via overlay patterns 76y may be construed as a diameter. In other example embodiments, when viewed from above, each of the first via overlay patterns 76x and the second via overlay patterns 76y may have a shape other than circular.

The width W2 of each of the first via overlay patterns 76x and the second via overlay patterns 76y may be narrower than the first width W1 of each of the first lower overlay patterns 74x and the second lower overlay patterns 74y. A width W3 of each of the first upper overlay patterns 78x and the second upper overlay patterns 78y may be wider than the first width W1 of each of the first lower overlay patterns 74x and the second lower overlay patterns 74y.

In an example embodiment, the first upper overlay pattern entirely covers the first lower overlay pattern in a plan view. The second upper overlay pattern entirely covers the second lower overlay pattern in a plan view In an example embodiment as shown in FIG. 7A, the first via overlay patterns 76x and the first upper overlay patterns 78x may be integrally connected. The second via overlay patterns 76y and the second upper overlay patterns 78y may be integrally connected. In detail, for example, the first via overlay patterns 76x and the first upper overlay patterns 78x may be formed using a dual damascene process, and may be embedded in a (third) insulating layer IL3. Thus, the first via overlay patterns 76x may be continuous with the first upper overlay patterns 78x, so that an interface between the first via overlay patterns 76x and the first upper overlay patterns 78x does not exist. That is, the first via overlay patterns 76x and the first upper overlay patterns 78x may be integrally connected to be contiguous with respect to each other. The second via overlay patterns 76y and the second upper overlay patterns 78y may be similarly formed using a dual damascene process. In contrast, the first via overlay patterns 76x and the first lower overlay patterns 74x are in contact with each other, with respective interfaces between the first via overlay patterns 76x and the first lower overlay patterns 74x. Similarly, the second via overlay patterns 76y and the second lower overlay patterns 74y are in contact with each other, with respective interfaces between the second via overlay patterns 76y and the second lower overlay patterns 74y. However, the inventive concept is not limited thereto.

In detail, as illustrated in FIG. 7B, the third insulating layer IL3 may be formed on the first lower overlay patterns 74x, with the first via overlay patterns 76x formed to penetrate through the third insulating layer IL3 to contact the first lower overlay patterns 74x. Subsequently, the first upper overlay patterns 78x may be formed in such a manner that a metal deposition process, a photolithography process, and an etching process are sequentially performed over the first via overlay patterns 76x. Thus, since the first via overlay patterns 76x and the first upper overlay patterns 78x may be formed using separate processes, respective interfaces IF may be formed between the first via overlay patterns 76x and the first upper overlay patterns 78x.

Figure 8A:
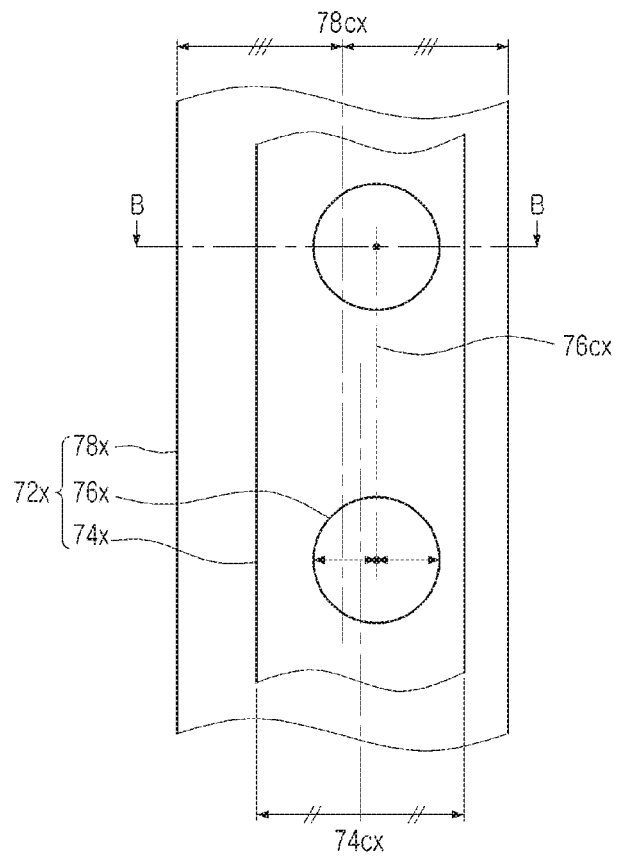
FIG. 8A illustrates a top view of a portion of a first overlay structure useful for describing a method of measuring an overlay of a semiconductor device according to example embodiments of the inventive concept.
Figure 8B:
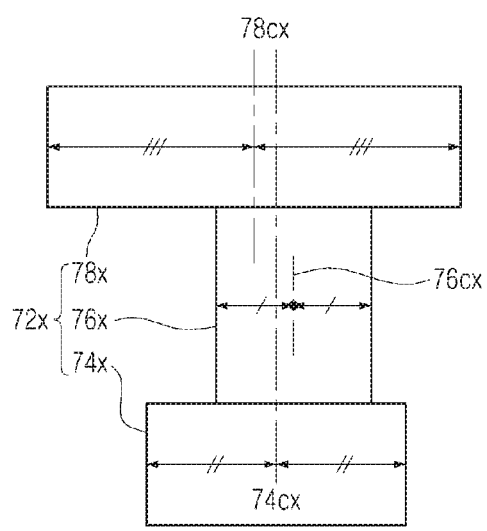
FIG. 8B illustrates a cross-sectional view of a portion of a first overlay structure useful for describing a method of measuring an overlay of a semiconductor device according to example embodiments of the inventive concept.

An example of a method of measuring an overlay between patterns using the first overlay structures 72x and the second overlay structures 72y will be described. In FIGS. 8A and 8B, a single first overlay structure among the first overlay structures 72x will be described as an example.

FIG. 8A illustrates a top view of a portion of a first overlay structure among first overlay structures 72x, useful for describing a method of measuring an overlay of a semiconductor device according to example embodiments of the inventive concept. FIG. 8B illustrates a cross-sectional view of a portion of a first overlay structure useful for describing a method of measuring an overlay of a semiconductor device according to example embodiments of the inventive concept. Thus, the overlay structure illustrated in FIGS. 8A and 8B may respectively have a plan shape and a side cross-sectional shape the same as those of one of the first overlay structures 72x described with respect to FIGS. 6 and 7A. Thus, since the overlay structure illustrated in FIGS. 8A and 8B may be understood as the same as the first overlay structures 72x described with respect to FIGS. 6 and 7A, detailed description of the plan shape and the side cross-sectional shape of the overlay structure illustrated in FIGS. 8A and 8B will hereinafter be omitted.

A method of measuring an overlay of the first overlay structures 72x will be described with reference to FIGS. 8A and 8B. The method of measuring the overlay may be equally applied to the second overlay structures 72y.

With reference to FIGS. 8A and 8B, the first overlay structures 72x may be measured and read using the second overlay measuring device 15 and the control device 24 shown in and described with respect to FIGS. 1 and 2, thereby generating overlay error data.

An SEM image of the first lower overlay patterns 74x, the first via overlay patterns 76x, and the first upper overlay patterns 78x of the first overlay structures 72x may be extracted using the second overlay measuring device 15 of FIGS. 1 and 2. The SEM image extracted using the method described above may be the same as a top view of FIG. 8A. The control device 24 of FIGS. 1 and 2 may generate overlay error data in such a manner that an overlay shift value among the first lower overlay patterns 74x, the first via overlay patterns 76x, and the first upper overlay patterns 78x is calculated using a plan view, as illustrated in FIG. 8A. In detail, the control device 24 may receive the SEM image from the second overlay measuring device 15; may extract a first lower overlay central axis 74cx of the first lower overlay patterns 74x; may extract a first via overlay central axis 76cx connecting (i.e., between) central portions of the first via overlay patterns 76x; and may extract a first upper overlay central axis 78cx of the first upper overlay patterns 78x from the SEM image.

Side surfaces of the first lower overlay patterns 74x may be viewed as lines in the SEM image. Thus, the first lower overlay central axis 74cx may be extracted using the side surfaces of the first lower overlay patterns 74x, viewed as lines. That is, the first lower overlay central axis 74cx may be determined as midway between opposite side surfaces of the first lower overlay patterns 74x viewed as lines in the SEM image. In a manner the same as that of the case described above, the first upper overlay central axis 78cx may be extracted.

Figure 19:
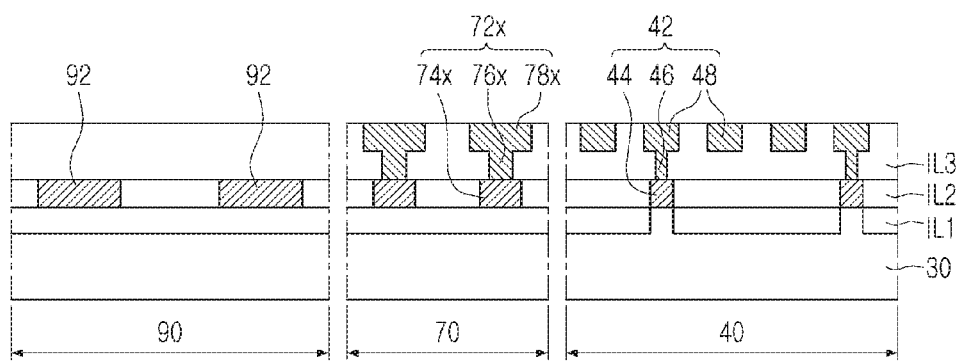
FIG. 19 illustrates a cross-sectional view of a semiconductor device according to example embodiments of the inventive concept.

In an example embodiment, the first via overlay central axis 76cx may deviate from the first lower overlay central axis 74cx in a corresponding direction. Thus, the control device 24 may calculate (determine) a distance between the first via overlay central axis 76cx and the first lower overlay central axis 74cx, and may calculate (determine) the distance and the direction by which the first via overlay central axis 76cx has deviated from the first lower overlay central axis 74cx. Thus, the distance and the direction by which the first via overlay patterns 76x have deviated from the first lower overlay patterns 74x can be determined. In a similar manner to the case described above, a distance and a direction by which the second via overlay patterns 76y have deviated from the second lower overlay patterns 74y can be determined. Thus, the overlay shift value of the first via overlay patterns 76x with respect to the first lower overlay pattern 74x in an X direction (direction D2), and the overlay shift value of the second via overlay patterns 76y with respect to the second lower overlay pattern 74y in a Y direction (direction D1), may be calculated and determined. A calculation result described above may be fed back to the photolithography process equipment 6 of the semiconductor processing system 3 of FIG. 1 through the control device 24. Thus, in the photolithography process equipment 6 of FIG. 1, a photolithography process may be performed on a subsequent semiconductor substrate by overlay correction of a photolithography process to form a via overlay pattern 76x (as shown in FIG. 19). In this case, a photolithography process to form the first via overlay patterns 76x and the second via overlay patterns 76y may be the same as a photolithography process to form circuit via patterns (46 of FIG. 19) formed simultaneously along with the first via overlay patterns 76x and the second via overlay patterns 76y and disposed to be coplanar with the first via overlay patterns 76x and the second via overlay patterns 76y.

In an example embodiment, the first upper overlay central axis 78cx may deviate from the first lower overlay central axis 74cx in a corresponding direction. Thus, the control device 24 of FIGS. 1 and 2 may calculate (determine) a distance between the first upper overlay central axis 78cx and the first lower overlay central axis 74cx, and may calculate (determine) the direction by which the first upper overlay central axis 78cx has deviated from the first lower overlay central axis 74cx. From a result described above, the distance and the direction by which the first upper overlay patterns 78x have deviated from the first lower overlay patterns 74x can be determined. In a similar manner to the case described above, a distance and a direction by which the second upper overlay patterns 78y have deviated from the second lower overlay patterns 74y can be determined. Thus, the overlay shift value in the X direction and the Y direction may be calculated and determined. A calculation result described above may be fed back to the photolithography process equipment 6 of the semiconductor processing system 3 of FIG. 1. Thus, in the photolithography process equipment 6, the photolithography process may be performed on a subsequent semiconductor substrate by overlay correction of the photolithography process to form the first upper overlay patterns 78x and the second upper overlay patterns 78y. In this case, the photolithography process to form the first upper overlay patterns 78x and the second upper overlay patterns 78y may be the same as a photolithography process to form circuit patterns (48 of FIG. 19) formed simultaneously along with the first upper overlay patterns 78x and the second upper overlay patterns 78y and disposed to be coplanar with the first upper overlay patterns 78x and the second upper overlay patterns 78y.

In an example embodiment, the overlay shift value between the first upper overlay patterns 78x and the first via overlay patterns 76x may be determined using the first upper overlay central axis 78cx and the first via overlay central axis 76cx. In a similar manner to the case described above, the overlay shift value between the second upper overlay patterns 78y and the second via overlay patterns 76y may be determined.

As illustrated in FIGS. 8A and 8B, a method of generating the overlay error data may be used in the same manner in various modified examples of overlay patterns to be described hereinafter. Hereinafter, in a case in which various modified examples of the overlay patterns are described, a description of the method of generating the overlay error data will be omitted, in order to avoid overlapping description.

Subsequently, with reference to FIGS. 9A and 9B, a modified example of overlay patterns in a first overlay area 70 will be described.

Figure 9A:
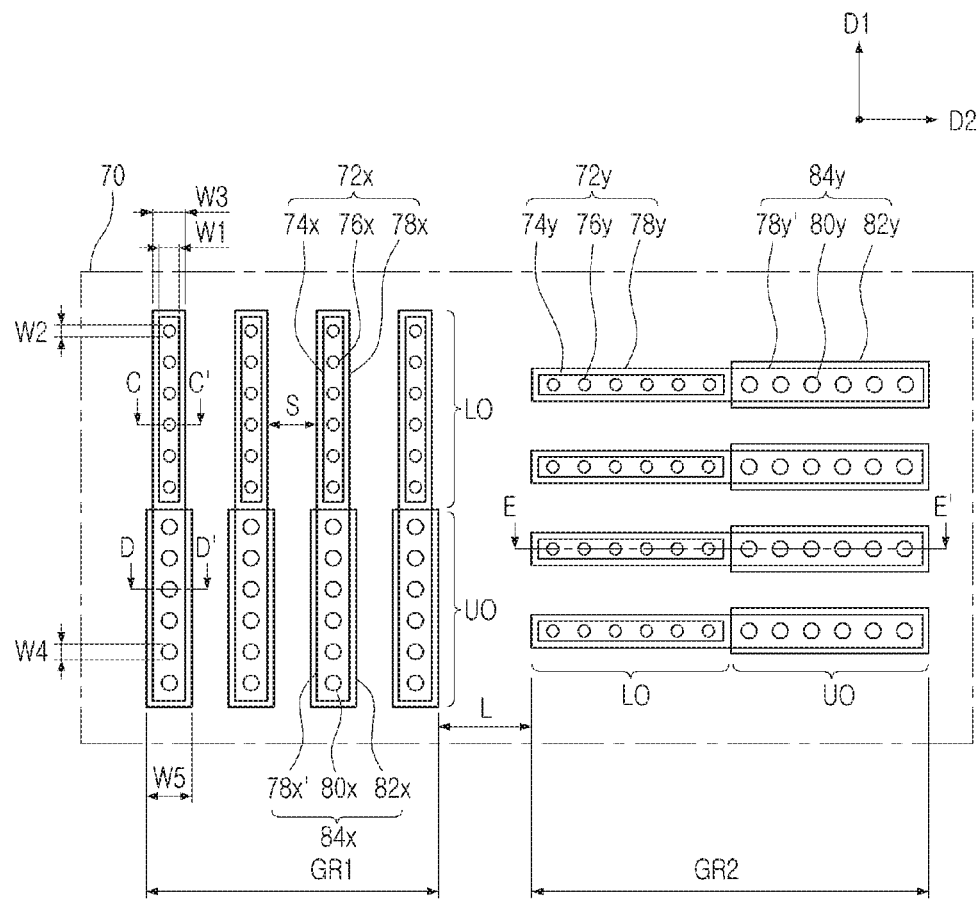
FIG. 9A illustrates a top view of modified overlay patterns in an overlay area of a semiconductor device according to example embodiments of the inventive concept.

FIG. 9A illustrates a top view of modified overlay patterns in the first overlay area 70 of a semiconductor device according to example embodiments of the inventive concept. FIG. 9B illustrates cross-sectional views of the modified overlay patterns taken along line C-C', line D-D', and line E-E' of FIG. 9A.

Figure 9B:
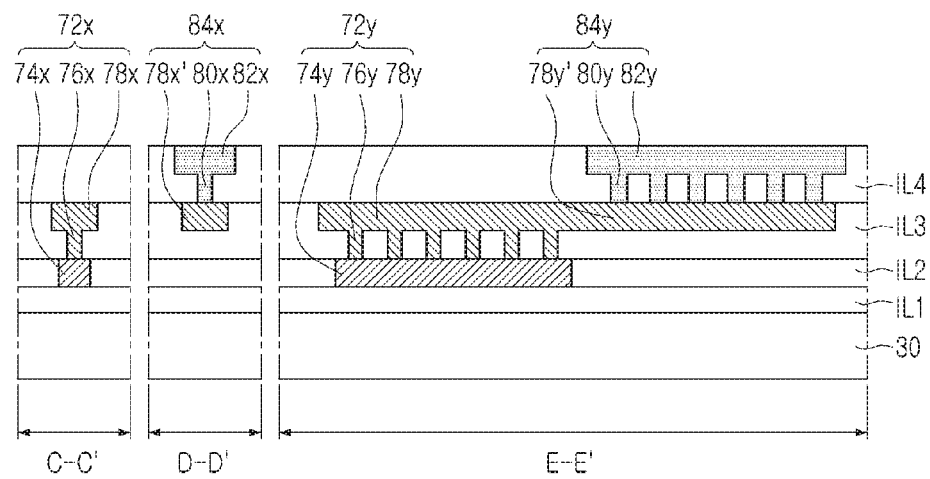
FIG. 9B illustrates a cross-sectional views of the modified overlay patterns of FIG. 9A.

With reference to FIGS. 9A and 9B, the first overlay area 70 of the semiconductor substrate 30 may include a lower overlay area LO and an upper overlay area UO.

First overlay structures 72x and second overlay structures 72y described with reference to FIGS. 6 and 7A may be disposed on the lower overlay area LO of the semiconductor substrate 30. Since the first overlay structures 72x and the second overlay structures 72y are described in detail with reference to FIGS. 6 and 7A, overlapping descriptions will be omitted hereinafter. Hereinafter, the first overlay structures 72x and the second overlay structures 72y will be described by citing components of the first overlay structures 72x and the second overlay structures 72y described with reference to FIGS. 6 and 7A.

Third overlay structures 84x as connected to the first overlay structures 72x, and fourth overlay structure 84y as connected to the second overlay structures 72y, may be disposed in the upper overlay area UO of the first overlay area 70.

The third overlay structures 84x may include extended portions 78x' which extend from the first upper overlay patterns 78x of the first overlay structures 72x into the upper overlay area UO; a plurality of third via overlay patterns 80x disposed on the extended portions 78x' which extend from the first upper overlay patterns 78x; and third upper overlay patterns 82x disposed on the plurality of third via overlay patterns 80x.

The extended portions 78x' which extend from the first upper overlay patterns 78x may have a width, that is, a third width W3, the same as that of the first upper overlay patterns 78x. The plurality of third via overlay patterns 80x may have a fourth width W4, narrower than the third width W3. The third upper overlay patterns 82x may have a fifth width W5, wider than the third width W3.

The fourth overlay structures 84y may include extended portions 78y' which extend from the second upper overlay patterns 78y of the second overlay structures 72y into the upper overlay area UO; a plurality of fourth via overlay patterns 80y disposed on the extended portions 78y' which extend from the second upper overlay patterns 78y; and fourth upper overlay patterns 82y disposed on the plurality of fourth via overlay patterns 80y.

The extended portions 78y' which extend from the second upper overlay patterns 78y may have the third width W3. The plurality of fourth via overlay patterns 80y may have the fourth width W4. The fourth upper overlay patterns 82y may have the fifth width W5.

The third via overlay patterns 80x, the fourth via overlay patterns 80y, the third upper overlay patterns 82x, and the fourth upper overlay patterns 82y, may be embedded in a (fourth) insulating layer IL4.

In an example embodiment, as described with respect to FIG. 7A, the first via overlay patterns 76x and the first upper overlay patterns 78x may be integrally connected to each other, while the second via overlay patterns 76y and the second upper overlay patterns 78y may be integrally connected to each other. In a manner similar to the case described above, the third via overlay patterns 80x and the third upper overlay patterns 82x may be integrally connected to each other, while the fourth via overlay patterns 80y and the fourth upper overlay patterns 82y may be integrally connected to each other. However, the inventive concept is not limited thereto. For example, in other embodiments, in a manner similar to description provided with respect to FIG. 7B, an interface may be formed between the first via overlay patterns 76x and the first upper overlay patterns 78x; an interface may be formed between the second via overlay patterns 76y and the second upper overlay patterns 78y; an interface may be formed between the third via overlay patterns 80x and the third upper overlay patterns 82x; and an interface may be formed between the fourth via overlay patterns 80y and the fourth upper overlay patterns 82y.

The first overlay structures 72x of FIGS. 6 and 7A may include the first via overlay patterns 76x, formed using a single photolithography process. However, the inventive concept is not limited thereto. For example, in other embodiments a semiconductor device according to a modified example may include an overlay structure having via overlay patterns formed using two different respective photolithography processes. An overlay structure including via overlay patterns formed using two photolithography processes will be described with reference to FIGS. 10A and 10B.

Figure 10A:
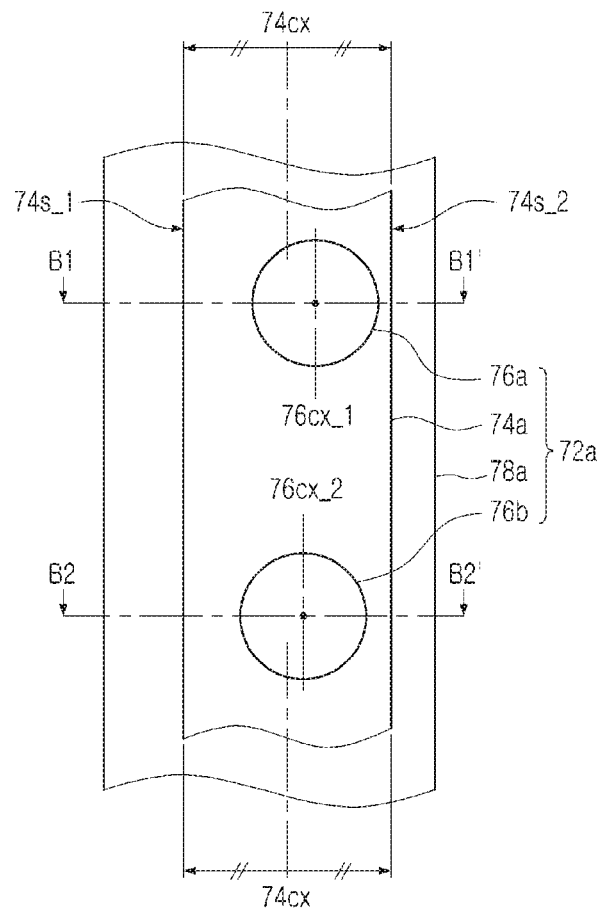
FIG. 10A illustrates a top view of a modified overlay pattern in a first overlay area of a semiconductor device according to example embodiments of the inventive concept.
Figure 10B:
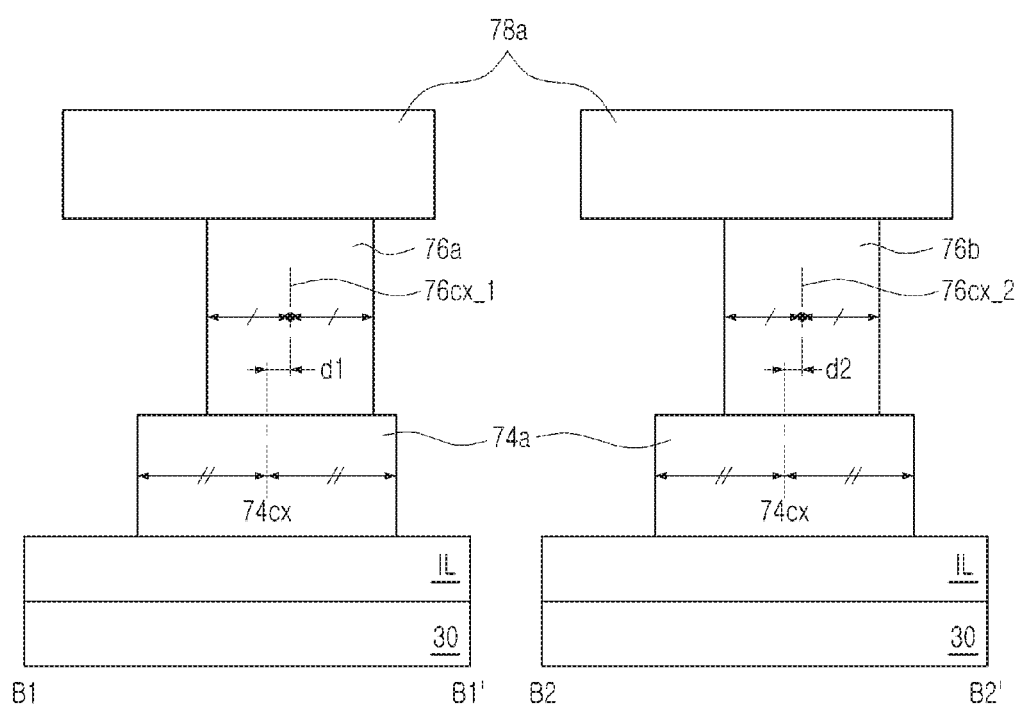
FIG. 10B illustrates cross-sectional views of a modified overlay structure of FIG. 10A.

FIG. 10A illustrates a top view of a modified overlay pattern in a first overlay area of a semiconductor device according to example embodiments of the inventive concept. FIG. 10B illustrates cross-sectional views taken along line B1-B1' and line B2-B2' of FIG. 10A.

With reference to FIGS. 10A and 10B, an overlay structure 72a may be disposed on an insulating structure IL on a semiconductor substrate 30.

The overlay structure 72a may include a lower overlay pattern 74a, an upper overlay pattern 78a that is wider than the lower overlay pattern 74a and that overlaps the lower overlay pattern 74a, and a first via overlay pattern 76a and a second via overlay pattern 76b interposed between the lower overlay pattern 74a and the upper overlay pattern 78a. The first via overlay pattern 76a and a second via overlay pattern 76b are disposed to be spaced apart from each other. Each of the first via overlay pattern 76a and the second via overlay pattern 76b may be narrower than the lower overlay pattern 74a. Lower overlay patterns 74a as shown in FIG. 10B may be characterized as first and second lower overlay patterns that are extended and formed to be integrated with each other. Similarly, upper overlay patterns 78a as shown in FIG. 10B may be characterized as first and second upper overlay patterns that are extended and formed to be integrated with each other.

An overlay shift value among the lower overlay pattern 74a, the first via overlay pattern 76a, and the upper overlay pattern 78a may be measured and calculated using a method of measuring an overlay as described with respect to FIGS. 8A and 8B, thereby generating overlay error data. An overlay shift value among the lower overlay pattern 74a, the second via overlay pattern 76b, and the upper overlay pattern 78a may be measured and calculated using the method of measuring an overlay, as described with respect to FIGS. 8A and 8B, thereby generating the overlay error data.

An example of overlay shifts of the first via overlay pattern 76a and the second via overlay pattern 76b will be described. An overlay shift d1 of the first via overlay pattern 76a with respect to the lower overlay pattern 74a may be greater than an overlay shift d2 of the second via overlay pattern 76b with respect to the lower overlay pattern 74a. For example, in a case in which overlay measurement is performed on the lower overlay pattern 74a and the first via overlay pattern 76a, and a central axis 74cx of the lower overlay pattern 74a and a central axis 76cx_1 of the first via overlay pattern 76a accurately match, it can be determined that an overlay shift is not present. In a case in which overlay measurement is performed on the lower overlay pattern 74a and the first via overlay pattern 76a, and the overlay shift d1 is present, a distance and a direction by which the central axis 76cx_1 of the first via overlay pattern 76a has deviated from the central axis 74cx of the lower overlay pattern 74a can be determined. In a manner similar to the case described above, in a case in which overlay measurement is performed on the lower overlay pattern 74a and the second via overlay pattern 76b, and the overlay shift d2 is present, a distance and a direction by which a central axis 76cx_2 of the second via overlay pattern 76b has deviated from the central axis 74cx of the lower overlay pattern 74a can be determined. Thus, the overlay error data may be generated from overlay shifts of the first via overlay pattern 76a and the second via overlay pattern 76b, as described with respect to FIGS. 8A and 8B. The overlay error data may be fed back to photolithography process equipment 6 as shown in FIG. 1 that performs a photolithography process to form the first via overlay pattern 76a and the second via overlay pattern 76b.

FIGS. 10A and 10B illustrate a single first via overlay pattern 76a and a single second via overlay pattern 76b, but the inventive concept is not limited thereto. Hereinafter, an example embodiment in which a plurality of first via overlay patterns 76a and a plurality of second via overlay patterns 76b are disposed will be described with reference to FIGS. 11 and 12. An example in which the plurality of first via overlay patterns 76a and the plurality of second via overlay patterns 76b are disposed, and a plurality of lower overlay patterns 74a and a plurality of upper overlay patterns 78a are disposed, will be described with reference to FIGS. 13 to 16.

A further modified example of overlay patterns in a first overlay area 70 will be described with reference to FIGS. 11 and 12.

Figure 11:
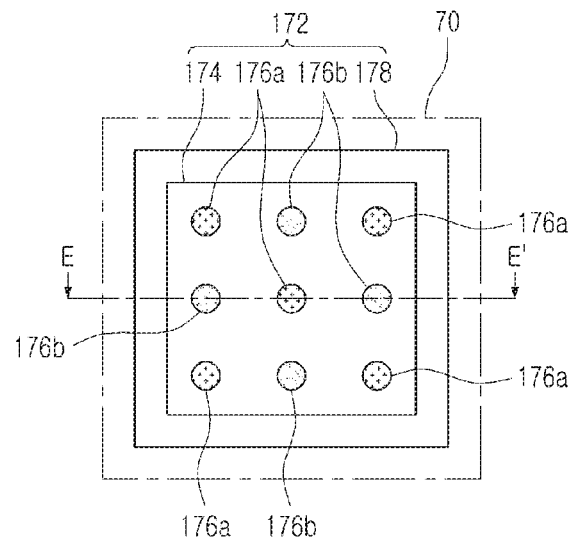
FIG. 11 illustrates a top view of modified overlay patterns of a first overlay area of a semiconductor device according to example embodiments of the inventive concept.

FIG. 11 illustrates a top view of modified overlay patterns in the first overlay area 70 of a semiconductor device according to example embodiments of the inventive concept. FIG. 12 illustrates a cross-sectional view taken along line F-F' of FIG. 11.

Figure 12:
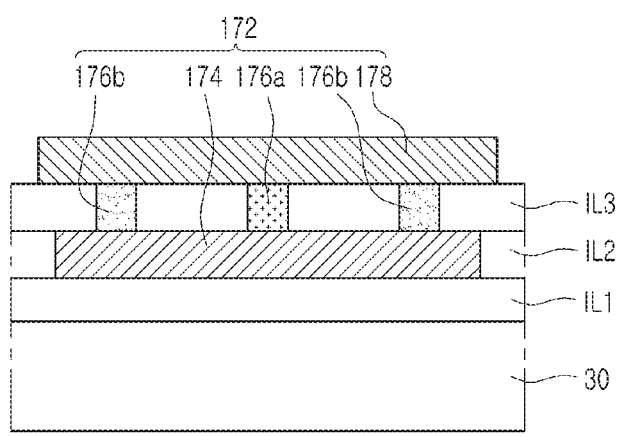
FIG. 12 illustrates a cross-sectional view of the modified overlay patterns of FIG. 11.

With reference to FIGS. 11 and 12, an overlay structure 172 may be disposed on the first overlay area 70 of a semiconductor substrate 30.

The overlay structure 172 may include a lower overlay pattern 174 disposed over the semiconductor substrate 30, an upper overlay pattern 178 disposed over the lower overlay pattern 174 and overlapping the lower overlay pattern 174, and first via overlay patterns 176a and second via overlay patterns 176b interposed between the lower overlay pattern 174 and the upper overlay pattern 178.

Space between the lower overlay pattern 174 and the semiconductor substrate 30 may be filled with an insulating structure IL1. The insulating structure IL1 does not include a metallic pattern, so as to avoid errors in overlay measurement.

When viewed from above, the lower overlay pattern 174 may have a quadrangular shape, while the upper overlay pattern 178 may have a quadrangular shape larger than that of the lower overlay pattern 174. When viewed from above, the lower overlay pattern 174 may be disposed inwardly of edges of the upper overlay pattern 178.

When viewed from above, the first via overlay patterns 176a and the second via overlay patterns 176b may be disposed inwardly of edges of the lower overlay pattern 174. The first via overlay patterns 176a and the second via overlay patterns 176b may be disposed to be spaced apart from side surfaces of the lower overlay pattern 174.

The first via overlay patterns 176a and the second via overlay patterns 176b may be alternately disposed in row and column directions. The first via overlay patterns 176a and the second via overlay patterns 176b may be alternately disposed in a row direction, and may be alternately disposed in a column direction. Thus, when viewed based on a single first via overlay pattern 176a, a via overlay pattern disposed adjacent to a single first via overlay pattern 176a in the row direction and a via overlay pattern disposed adjacent thereto in the column direction may be provided as the second via overlay patterns 176b.

The first via overlay patterns 176a may be provided as a metallic via pattern formed using a first photolithography process, while the second via overlay patterns 176b may be provided as a metallic via pattern formed using a second photolithography process.

Subsequently, a further modified example of overlay patterns in a first overlay area 70 will be described with reference to FIGS. 13 and 14.

Figure 13:
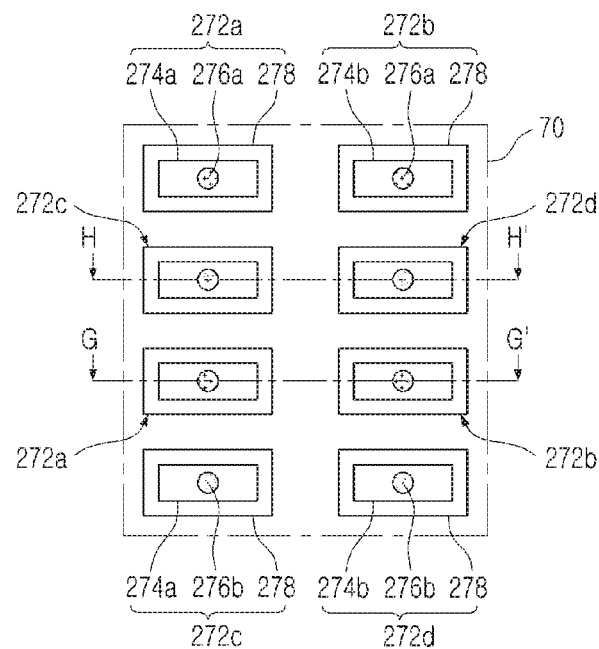
FIG. 13 illustrates a top view of modified overlay patterns in a first overlay area of a semiconductor device according to example embodiments of the inventive concept.

FIG. 13 illustrates a top view of modified overlay patterns in the first overlay area 70 of a semiconductor device according to example embodiments of the inventive concept. FIG. 14 illustrates cross-sectional views of the modified overlay patterns taken along line G-G' and line F-F' of FIG. 13.

Figure 14:
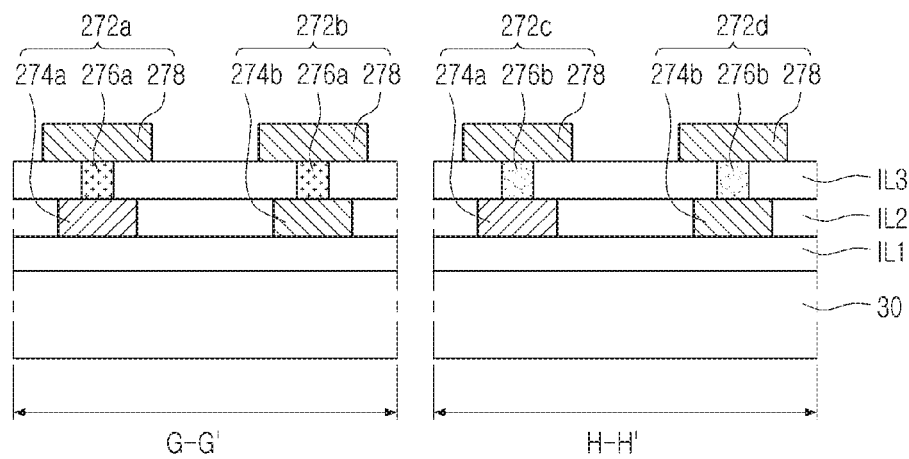
FIG. 14 illustrates cross-sectional views of the modified overlay patterns of FIG. 13.

With reference to FIGS. 13 and 14, a first overlay structure 272a, a second overlay structure 272b, a third overlay structure 272c, and a fourth overlay structure 272d may be disposed on the first overlay area 70 of a semiconductor substrate 30. The first overlay structure 272a and the second overlay structure 272b may be disposed adjacent to each other in the row direction. The third overlay structure 272c and the fourth overlay structure 272d may be disposed adjacent to each other in the row direction. A pair of the first overlay structure 272a and the second overlay structure 272b disposed adjacent to each other, and a pair of the third overlay structure 272c and the fourth overlay structure 272d disposed adjacent to each other, may be alternately disposed in the column direction.

The first overlay structure 272a may include a first lower overlay pattern 274a, a first via overlay pattern 276a disposed on the first lower overlay pattern 274a, and an upper overlay pattern 278 disposed on the first via overlay pattern 276a.

The second overlay structure 272b may include a second lower overlay pattern 274b, the first via overlay pattern 276a disposed on the second lower overlay pattern 274b, and the upper overlay pattern 278 disposed on the first via overlay pattern 276a.

The third overlay structure 272c may include the first lower overlay pattern 274a, a second via overlay pattern 276b disposed on the first lower overlay pattern 274a, and the upper overlay pattern 278 disposed on the second via overlay pattern 276b.

The fourth overlay structure 272d may include the second lower overlay pattern 274b, the second via overlay pattern 276b disposed on the second lower overlay pattern 274b, and the upper overlay pattern 278 disposed on the second via overlay pattern 276b.

The first lower overlay pattern 274a and the second lower overlay pattern 274b may be formed to have a quadrangular shape of the same size, and may be provided as patterns formed using different photolithography processes.

The first via overlay pattern 276a and the second via overlay pattern 276b may be formed to have the same size, and may be provided as patterns formed using different photolithography processes. The first via overlay pattern 276a and the second via overlay pattern 276b may be disposed inwardly of edges of the first lower overlay pattern 274a and the second lower overlay pattern 274b. The upper overlay pattern 278 may be formed to have a quadrangular shape larger than the first lower overlay pattern 274a and the second lower overlay pattern 274b, and may cover the first lower overlay pattern 274a and the second lower overlay pattern 274b.

Subsequently, a further modified example of overlay patterns in a first overlay area 70 will be described with reference to FIGS. 15 and 16.

Figure 15:
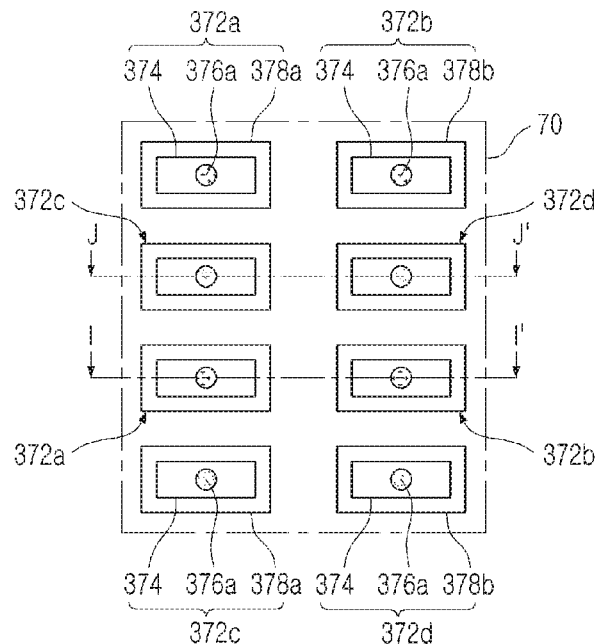
FIG. 15 illustrates a top view of modified overlay patterns of a first overlay area of a semiconductor device according to example embodiments of the inventive concept.

FIG. 15 illustrates a top view of modified overlay patterns in the first overlay area 70 of a semiconductor device according to example embodiments of the inventive concept. FIG. 16 illustrates cross-sectional views taken along line I-I' and line J-J' of FIG. 15.

Figure 16:
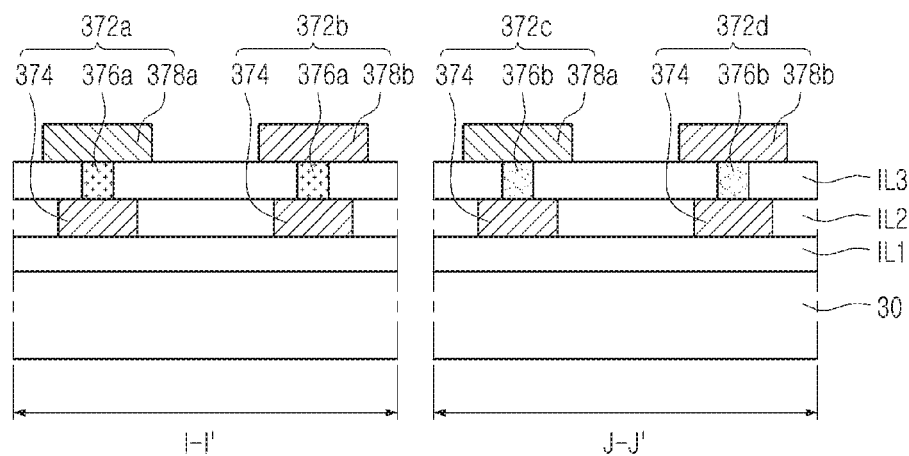
FIG. 16 illustrates cross-sectional views of the modified overlay patterns of FIG. 15.

With reference to FIGS. 15 and 16, a first overlay structure 372a, a second overlay structure 372b, a third overlay structure 372c, and a fourth overlay structure 372d may be disposed on the first overlay area 70 of a semiconductor substrate 30. The first overlay structure 372a and the second overlay structure 372b may be disposed adjacent to each other in a row direction. The third overlay structure 372c and the fourth overlay structure 372d may be disposed adjacent to each other in the row direction. A pair of the first overlay structure 372a and the second overlay structure 372b disposed adjacent to each other, and a pair of the third overlay structure 372c and the fourth overlay structure 372d disposed adjacent to each other, may be alternately disposed in a column direction.

The first overlay structure 372a may include a lower overlay pattern 374, a first via overlay pattern 376a disposed on the lower overlay pattern 374, and a first upper overlay pattern 378a disposed on the first via overlay pattern 376a.

The second overlay structure 372b may include the lower overlay pattern 374, the first via overlay pattern 376a disposed on the lower overlay pattern 374, and a second upper overlay pattern 378b disposed on the first via overlay pattern 376a.

The third overlay structure 372c may include the lower overlay pattern 374, a second via overlay pattern 376b disposed on the lower overlay pattern 374, and the first upper overlay pattern 378a disposed on the second via overlay pattern 376b.

The fourth overlay structure 372d may include the lower overlay pattern 374, the second via overlay pattern 376b disposed on the lower overlay pattern 374, and the second upper overlay pattern 378b disposed on the second via overlay pattern 376b.

The lower overlay patterns 374 may be formed to have a quadrangular shape of the same size, and may be provided as patterns formed using the same photolithography process.

The first via overlay pattern 376a and the second via overlay pattern 376b may be formed to have the same size, and may be provided as patterns formed using different photolithography processes. The first via overlay pattern 376a and the second via overlay pattern 376b may be disposed inwardly of edges of the lower overlay patterns 374. The first upper overlay pattern 378a and the second upper overlay pattern 378b may be formed to have a quadrangular shape larger than that of the lower overlay patterns 374, and may cover the lower overlay patterns 374.

As described in example embodiments of the inventive concept, a plurality of first overlay areas (70 of FIGS. 5, 6, 9A and 9B, 11, 13, and 15) may be disposed on the semiconductor substrate 30. At least a portion of the plurality of first overlay areas 70 may be disposed in chip areas (CA of FIG. 4), while the remainder of areas may be disposed in a scribe lane area SL. In addition, a second overlay area (90 of FIG. 5) may be disposed in the scribe lane area SL. The first overlay area 70 and the second overlay area 90 disposed on the semiconductor substrate 30 may be described with reference to FIGS. 17A, 17B, and 17C.

Figure 17A:
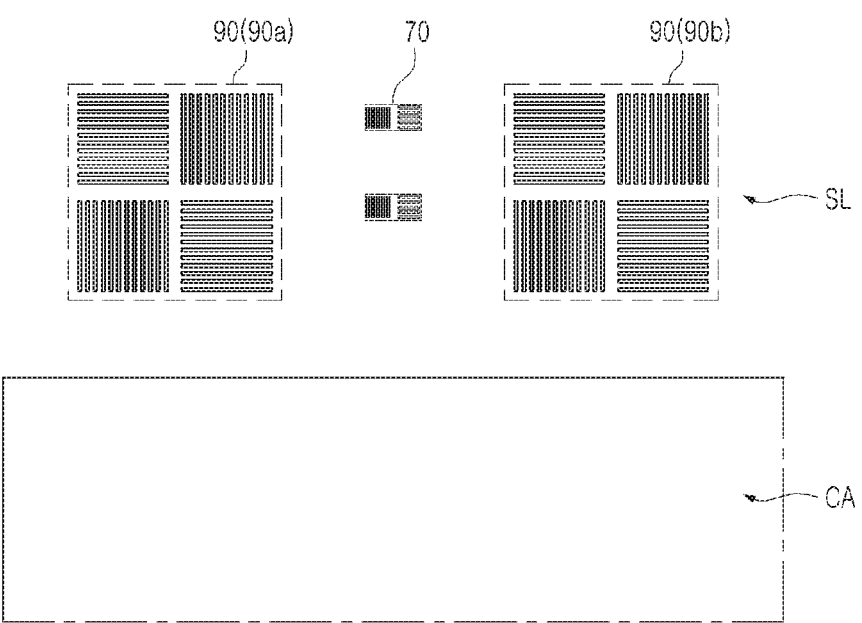
FIG. 17A illustrates a partially enlarged top view of a semiconductor device according to example embodiments of the inventive concept.
Figure 17B:
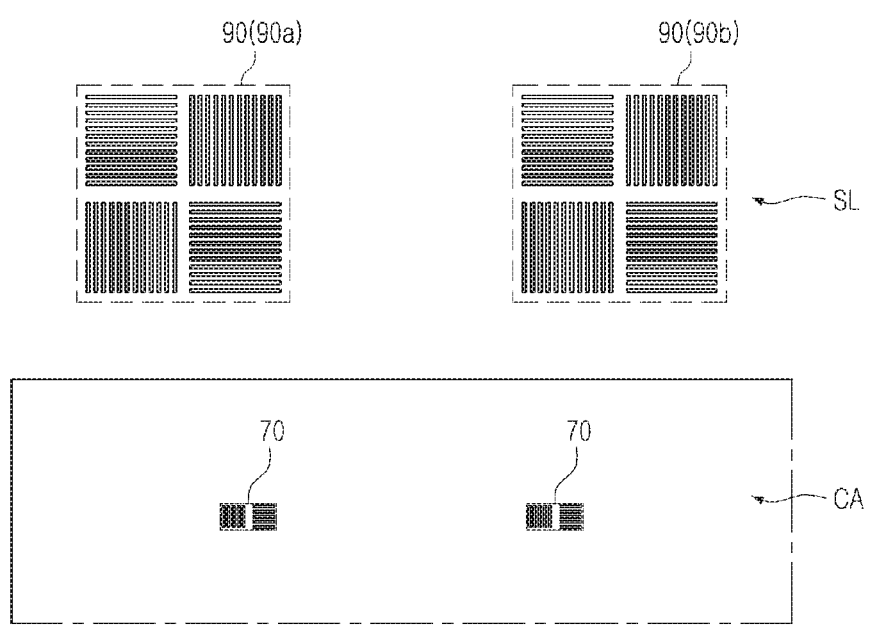
FIG. 17B illustrates a partially enlarged top view of a modified semiconductor device according to example embodiments of the inventive concept
Figure 17C:
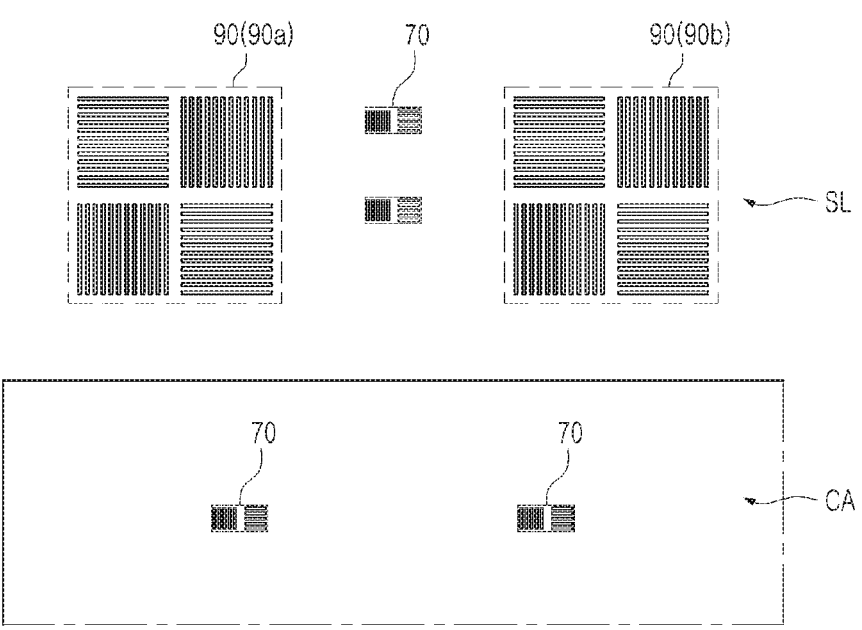
FIG. 17C illustrates a partially enlarged top view of a modified semiconductor device according to example embodiments of the inventive concept.

FIGS. 17A, 17B and 17C illustrate partially enlarged top views of portions of the chip area (CA of FIG. 4) and the scribe lane area (SL of FIG. 4) of the semiconductor substrate 30 according to respective example embodiments of the inventive concept. With reference to FIG. 17A, the first overlay area 70 and the second overlay area 90 may be disposed in the scribe lane area SL. The second overlay area 90 may include a plurality of second overlay areas 90a and 90b, disposed to be spaced apart from each other. In a manner similar to the case described above, the first overlay area 70 may also include a plurality of first overlay areas.

With reference to FIG. 17B, the second overlay area 90, including a plurality of second overlay areas 90a and 90b, may be disposed in the scribe lane area SL, while the first overlay area 70, including the plurality of first overlay areas, may be disposed in the chip area CA.

Subsequently, with reference to FIG. 17C, the second overlay area 90 including the plurality of second overlay areas 90a and 90b and the first overlay area 70 including the plurality of first overlay areas may be disposed in the scribe lane area SL. In addition, the first overlay area 70 including the plurality of first overlay areas may be disposed in the chip area CA. Thus, the first overlay area 70 may be disposed in the scribe lane area SL and the chip areas CA.

A first overlay area 70 disposed in a shot area (SA of FIG. 3) described with reference to FIG. 3 will be described with reference to FIG. 18.

Figure 18:
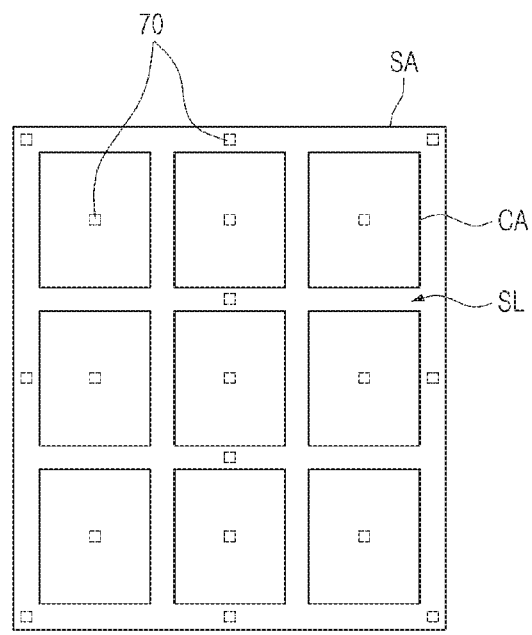
FIG. 18 illustrates a top view of a first overlay area disposed in a shot area of a semiconductor device according to example embodiments of the inventive concept.

FIG. 18 illustrates a top view of the first overlay area 70 disposed in a single shot area SA. With reference to FIG. 18, a plurality of first overlay areas 70 may be disposed, and may be uniformly disposed in a single shot area SA.

In an example embodiment, a plurality of chip areas CA may be disposed in a single shot area SA. Positions of the first overlay areas 70 disposed in each of the plurality of chip areas CA may be the same. For example, a position of the first overlay area 70 disposed in a chip area among the plurality of chip areas CA may be the same as a position of the first overlay area 70 disposed in a different chip area.

In an example embodiment, a plurality of first overlay areas 70 may be disposed to have maximal dispersion in a single shot area SA. Thus, an overlay error measured and calculated using overlay patterns in the first overlay area 70 may be similar to an overlay error of circuit patterns in the chip area CA. Subsequently, a semiconductor device according to an embodiment will be described with reference to FIG. 19.

FIG. 19 illustrates a cross-sectional view of a semiconductor device according to example embodiments of the inventive concept. With reference to FIG. 19, overlay marks 92 (e.g., first overlay marks 92x or second overlay marks 92y such as shown in FIG. 5) may be disposed on a second overlay area 90 of a semiconductor substrate 30. An overlay structure 72x may be disposed on the first overlay area 70 of the semiconductor substrate 30. The overlay structure 72x may be provided as a first overlay structure 72x described with respect to FIGS. 6 and 7a. Since a detailed description of the overlay structure 72x may be understood through description provided with reference to FIGS. 6 and 7A, detailed description thereof will be here omitted.

The overlay marks 92 of the second overlay area 90 may be coplanar with one pattern among a first lower overlay pattern 74x, a first via overlay pattern 76x, and a first upper overlay pattern 78x of the first overlay structure 72x. As shown, in this example embodiment the overlay marks 92 of the second overlay area 90 are coplanar with first lower overlay patterns 74x of the first overlay structure 72x. The overlay marks 92 may be formed to be wider than the first lower overlay patterns 74x.

A circuit interconnection structure 42 may be disposed on a circuit area 40 of the semiconductor substrate 30. The circuit interconnection structure 42 may include a lower circuit pattern 44, a circuit via pattern 46 disposed on the lower circuit pattern 44, and a circuit wiring 48 disposed on and over the circuit via pattern 46.

The lower circuit pattern 44 may be coplanar with the first lower overlay patterns 74x of the first overlay structure 72x; the circuit via pattern 46 may be coplanar with the first via overlay patterns 76x of the first overlay structure 72x; and the circuit wiring 48 may be coplanar with the first upper overlay patterns 78x of the first overlay structure 72x.

The lower circuit pattern 44 may be electrically connected to the semiconductor substrate 30. The overlay marks 92 and the first lower overlay patterns 74x may be isolated from the semiconductor substrate 30.

In example embodiments of the inventive concept, the lower circuit pattern 44 may be narrower than the first lower overlay patterns 74x.

In example embodiments, a diameter of the circuit via pattern 46 may be smaller than that of the first via overlay patterns 76x.

In example embodiments, the circuit wiring 48 may be narrower than the first upper overlay patterns 78x.

Subsequently, an example of a method of forming a semiconductor device according to an example embodiment will be described with reference to FIGS. 20A to 20H.

FIGS. 20A, 20B, 20C, 20D, 20E, 20F, 20G and 20H illustrate respective cross-sectional views of a method of forming a semiconductor device according to example embodiments of the inventive concept.

Figure 20A:
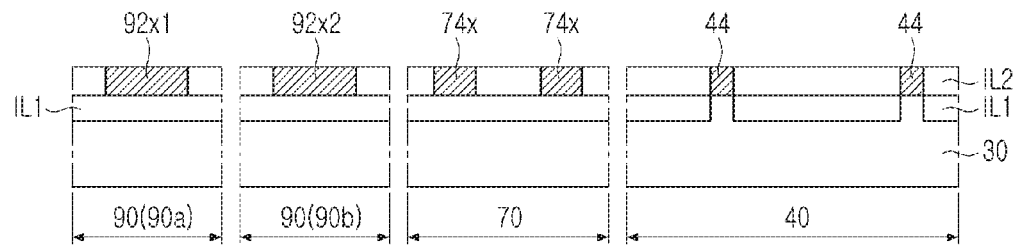
FIGS. 20A, 20B, 20C, 20D, 20E, 20F, 20G and 20H illustrate respective cross-sectional views of a method of forming a semiconductor device according to example embodiments of the inventive concept.

With reference to FIG. 20A, a semiconductor substrate 30 may include a second overlay area 90, a first overlay area 70, and a circuit area 40. The second overlay area 90 may include a first photolithography overlay area 90a and a second photolithography overlay area 90b.

A lower (first) insulating structure IL may be formed on the semiconductor substrate 30.

A (second) insulating layer IL2 may be formed on the lower insulating structure IL1.

A first photolithography overlay mark 92x1, a second photolithography overlay mark 92x2, a lower overlay pattern 74x, and a lower circuit pattern 44 each penetrating through the insulating layer IL2, may be formed simultaneously on the semiconductor substrate 30.

The first photolithography overlay mark 92x1 may be formed on the first photolithography overlay area 90a of the semiconductor substrate 30; the second photolithography overlay mark 92x2 may be formed on the second photolithography overlay area 90b of the semiconductor substrate 30; the lower overlay pattern 74x may be formed on the first overlay area 70 of the semiconductor substrate 30; and the lower circuit pattern 44 may be disposed on the circuit area 40 of the semiconductor substrate 30.

The first photolithography overlay mark 92x1 and the second photolithography overlay mark 92x2 may be formed to be wider than the lower overlay pattern 74x and the lower circuit pattern 44. The lower overlay pattern 74x may be formed to be wider than the lower circuit pattern 44.

Figure 20B:
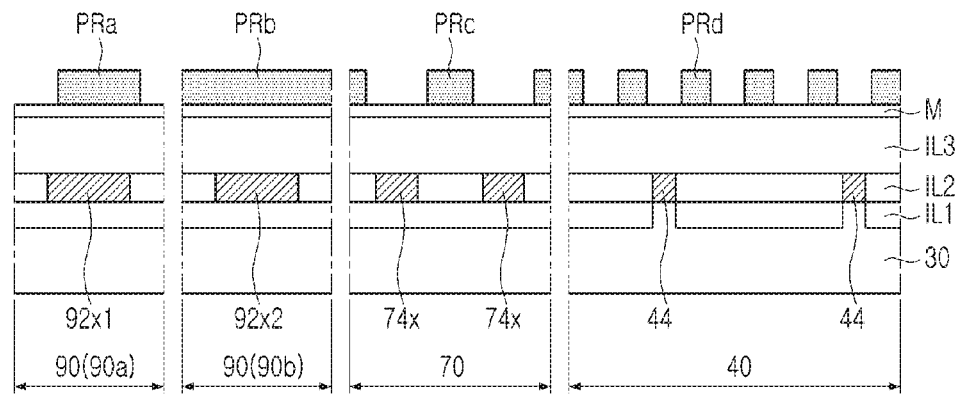

With reference to FIG. 20B, a (third) insulating layer IL3 may be formed on the first photolithography overlay mark 92x1, the second photolithography overlay mark 92x2, the lower overlay pattern 74x, and the lower circuit pattern 44. The insulating layer IL3 may be formed using a silicon oxide or a low dielectric material. A mask layer M may be formed on the insulating layer IL3.

First photoresist patterns PRa, PRb, PRc, and PRd may be formed on the mask layer M by performing a first photolithography process.

A first photoresist pattern formed on the first photolithography overlay area 90a of the semiconductor substrate 30 may be provided as a first photolithography overlay photoresist pattern PRa for overlay measurement.

A first photoresist pattern formed on the second photolithography overlay area 90b of the semiconductor substrate 30 may be provided as a protective photoresist pattern PRb to protect the second photolithography overlay mark 92x2.

A first photoresist pattern formed on the first overlay area 70 of the semiconductor substrate 30 may be provided as an upper overlay photoresist pattern PRc to form upper overlay patterns (78x of FIG. 20H) overlapping the lower overlay patterns 74x.

Figure 20C:
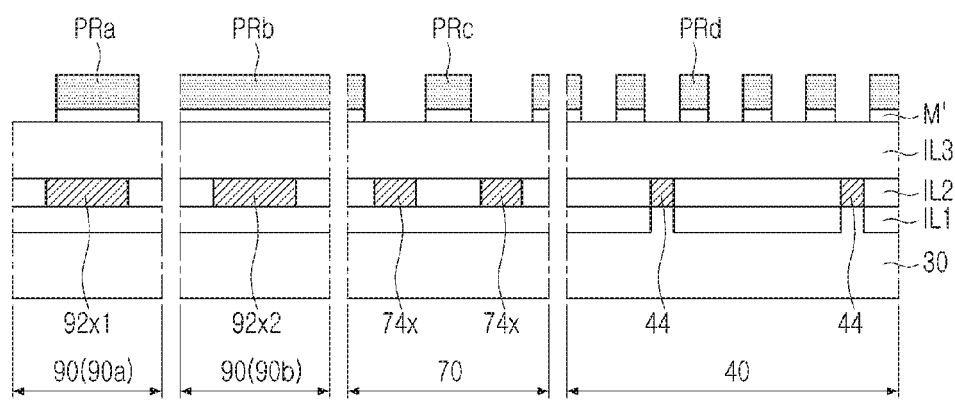
Figure 20D:
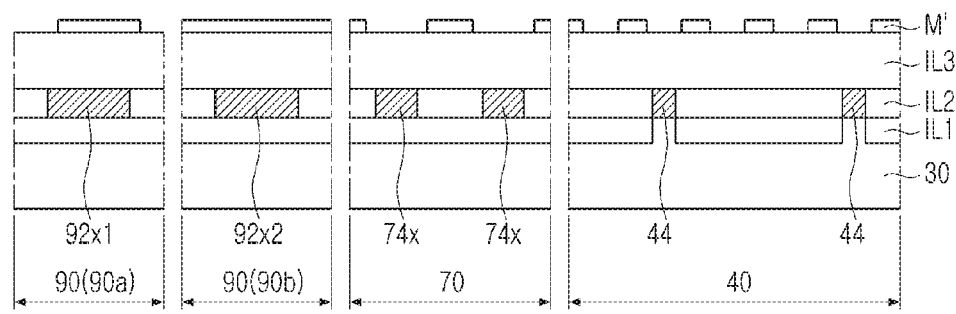
Figure 20E:
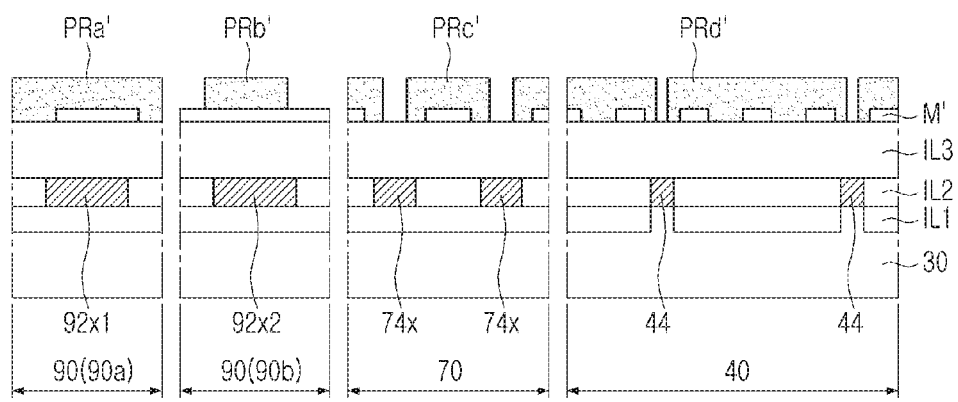
Figure 20F:
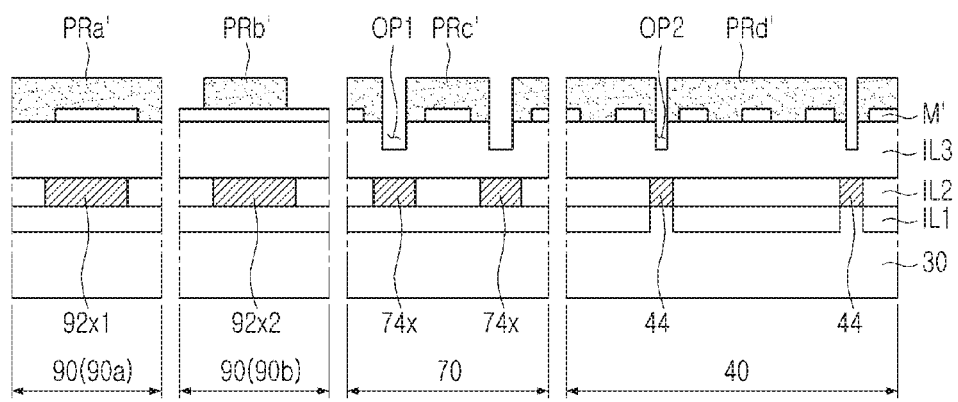
Figure 20G:
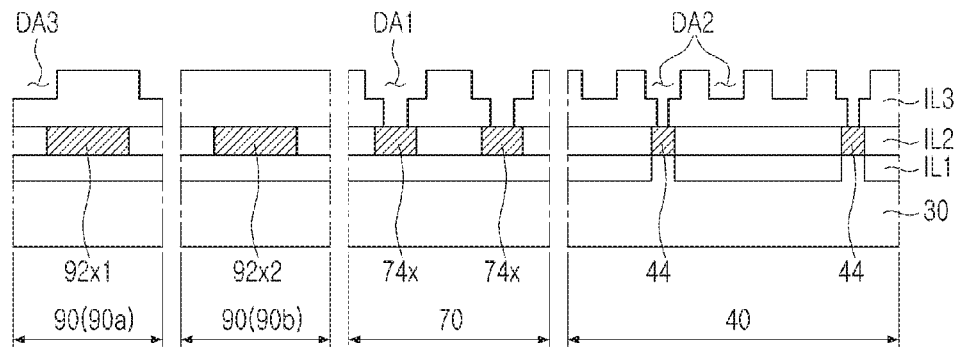
Figure 20H:
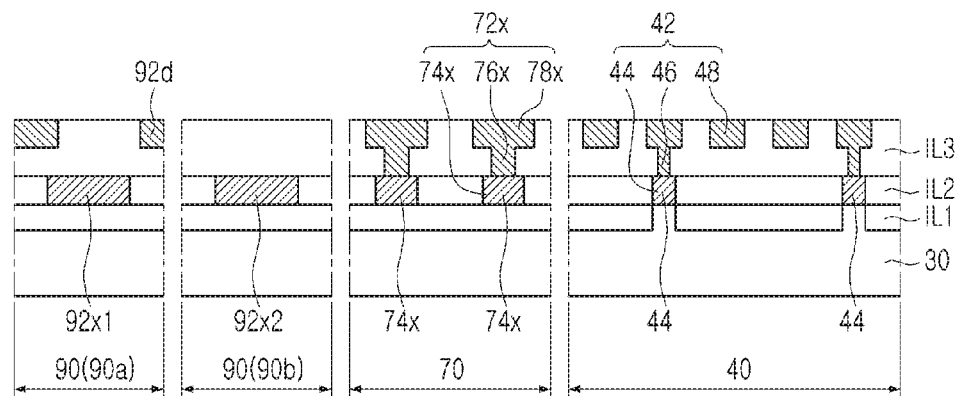

A first photoresist pattern formed on the circuit area 40 of the semiconductor substrate 30 may be provided as a circuit wiring photoresist pattern PRd to form circuit wirings (48 of FIG. 20H).

The first photolithography overlay photoresist pattern PRa and the first photolithography overlay mark 92x1 may be measured and read using a first overlay measuring device 9 and a control device 24 such as shown in FIG. 2, thereby generating overlay error data. In a case in which the overlay error data is within a set reference value, a subsequent process may be performed. In a case in which the generated overlay error data is out of (over) the set reference value, a photolithography process may be performed again using photolithography process equipment 6 such as shown in FIG. 1 with which overlay correction was performed using the generated overlay error data.

With reference to FIG. 20C, a mask pattern M' may be formed by etching the mask layer M, using the first photoresist patterns PRa, PRb, PRc, and PRd.

The mask pattern M' may expose the first overlay area 70 of the semiconductor substrate 30 and the insulating layer IL3 on the circuit area 40.

With reference to FIG. 20D, the mask pattern M' may be exposed by removing the first photoresist patterns PRa, PRb, PRc, and PRd.

With reference to FIG. 20E, second photoresist patterns PRa', PRb', PRc', and PRd' may be formed on the mask pattern M' by performing a second photolithography process.

A second photoresist pattern formed on the first photolithography overlay area 90a of the semiconductor substrate 30 may be provided as a dummy photoresist pattern PRa'.

A second photoresist pattern formed on the second photolithography overlay area 90b of the semiconductor substrate 30 may be provided as a second photolithography overlay photoresist pattern PRb' for overlay measurement.

A second photoresist pattern formed on the first overlay area 70 of the semiconductor substrate 30 may be provided as a via overlay photoresist pattern PRc' to form via overlay patterns (76x of FIG. 20h) overlapping the lower overlay patterns 74x.

A second photoresist pattern formed on the circuit area 40 of the semiconductor substrate 30 may be provided as a circuit via photoresist pattern PRd' to form circuit via patterns (46 of FIG. 20H).

The second photolithography overlay photoresist pattern PRb' and the second photolithography overlay mark 92x2 may be measured and read using the first overlay measuring device 9 and the control device 24 of FIG. 2, thereby generating overlay error data. In a case in which the overlay error data is within the set reference value, a subsequent process may be performed. In a case in which the generated overlay error data is out of (over) the set reference value, the photolithography process may be performed again.

With reference to FIG. 20F, via openings OP1 and OP2 may be formed by etching a portion of the insulating layer IL3 using the second photoresist patterns PRa', PRb', PRc', and PRd'.

With reference to FIG. 20G, the second photoresist patterns PRa', PRb', PRc', and PRd' may be removed, and dual damascene openings DA1, DA2, and DA3 may be formed by etching the insulating layer IL3 using the mask pattern M' as an etching mask.

With reference to FIG. 20H, a metal layer filling the dual damascene openings DA1, DA2, and DA3 may be formed. Thus, a circuit via pattern 46 and a circuit wiring 48 having a damascene structure may be formed on the circuit area 40 of the semiconductor substrate 30. The via overlay pattern 76x and the upper overlay pattern 78x having the damascene structure may be formed on the first overlay area 70 of the semiconductor substrate 30. A dummy pattern 92d may be formed on the first photolithography overlay area 90a of the semiconductor substrate 30.

Thus, the circuit interconnection structure 42, including the lower circuit pattern 44, the circuit via pattern 46, and the circuit wiring 48, may be formed on the circuit area 40 of the semiconductor substrate 30. An overlay structure 72x, including the lower overlay pattern 74x, the via overlay pattern 76x, and the upper overlay pattern 78x, may be formed on the first overlay area 70 of the semiconductor substrate 30.

Subsequently, the overlay structure 72x may be measured and read using the second overlay measuring device 15 and the control device 24 such as shown in FIGS. 1 and 2 in a manner the same as described in FIGS. 8A and 8B, thereby generating overlay error data. The overlay error data generated by measuring and reading the overlay structure 72x may be fed back to the photolithography process equipment 6 of FIG. 1. For example, overlay error data generated by measuring and reading the lower overlay pattern 74x and the upper overlay pattern 78x in the overlay structure 72x may be fed back to the photolithography process equipment 6 to form first photoresist patterns (e.g., PRa, PRb, PRc, and PRd of FIG. 20B) of a subsequent process.

Overlay error data generated by measuring and reading the lower overlay pattern 74x and the via overlay pattern 76x may be fed back to the photolithography process to form second photoresist patterns (e.g., PRa', PRb', PRc', and PRd' of FIG. 20E) of a subsequent process.

According to example embodiments of the inventive concept, a semiconductor processing system 3 including the first overlay measuring device 9 and the second overlay measuring device 15 measuring an overlay using different methods may be provided. Since the first overlay measuring device 9 uses a photoresist pattern, relatively quick feedback may be possible. Since the second overlay measuring device 9 uses the overlay structure 72x, including patterns similar to an actual circuit interconnection structure 42, an overlay shift value similar to that generated in the actual circuit interconnection structure 42 may be determined. Thus, overlay consistency may be improved. In terms of a semiconductor device formed using the semiconductor processing system 3 according to example embodiments of the inventive concept, defects caused by misalignment may be reduced. The semiconductor processing system 3 may improve productivity.

As set forth above, according to example embodiments of the inventive concept, a first overlay area for measuring an overlay using an overlay structure including metallic patterns stacked in an amount of at least three layers, and a second overlay area for measuring an overlay using a photoresist pattern, may be provided. The first overlay area and the second overlay area may be complementary, thereby reducing defects caused by misalignment and consequently increasing productivity. In addition, since the first overlay area and the second overlay area enable an overlay to be measured using metallic patterns similar to an actual circuit pattern, overlay consistency may be improved.

While example embodiments have been shown and described above, it will be apparent to those skilled in the art that modifications and variations could be made without departing from the scope of the present inventive concept as defined by the appended claims.

What is claimed is:

1. A semiconductor device, comprising:
   a first overlay group disposed on a semiconductor substrate; and
   a second overlay group disposed on the semiconductor substrate, adjacent to and spaced apart from the first overlay group,
   wherein the first overlay group comprises first lower overlay patterns, first upper overlay patterns overlapping the first lower overlay patterns, and first via overlay patterns interposed between the first lower overlay patterns and the first upper overlay patterns,
   wherein the second overlay group comprises second lower overlay patterns, second upper overlay patterns overlapping the second lower overlay patterns, and second via overlay patterns interposed between the second lower overlay patterns and the second upper overlay patterns,
   wherein each of the first lower overlay patterns and the first upper overlay patterns extend in a first direction, wherein each of the second lower overlay patterns and the second upper overlay patterns extend in a second direction perpendicular to the first direction, wherein a width in the second direction of each of the first upper overlay patterns is greater than a width in the second direction of each of the first lower overlay patterns, wherein a width in the second direction of each of the first via overlay patterns is smaller than a width in the second direction of each of the first lower overlay patterns, wherein a width in the first direction of each of the second upper overlay patterns is greater than a width in the first direction of each of the second lower overlay patterns, wherein a width in the first direction of each of the second via overlay patterns is smaller than a width in the first direction of each of the second lower overlay patterns, wherein a plurality of first via overlay patterns of the first via overlay patterns is interposed between a single first lower overlay pattern of the first lower overlay patterns and a single first upper overlay pattern of the first upper overlay patterns.

2. The semiconductor device of claim 1, wherein the second lower overlay patterns have end portions disposed to be adjacent to and spaced apart from the first overlay group, and wherein the first lower overlay patterns are disposed spaced apart from each other by a first distance, each of the first lower overlay patterns has a first width in the second direction, and a distance between a side surface of a first lower overlay pattern from among the first lower overlay patterns disposed most adjacent to the second lower overlay patterns and the end portions of the second lower overlay patterns is greater than a sum of the first distance and the first width.

3. The semiconductor device of claim 2, wherein the first width of each of the first lower overlay patterns is less than the first distance between the first lower overlay patterns.

4. The semiconductor device of claim 1, wherein a conductive material pattern is not interposed between the first overlay group and the second overlay group.

5. The semiconductor device of claim 1, wherein a conductive material pattern is not interposed between the semiconductor substrate and the first overlay group, and is not interposed between the semiconductor substrate and the second overlay group.

6. The semiconductor device of claim 1, wherein the first upper overlay patterns comprise extended portions which extend in the first direction from portions of the first upper overlay patterns overlapped with the first lower overlay patterns, and the second upper overlay patterns comprise extended portions which extend in the second direction from portions of the second upper overlay patterns overlapped with the second lower overlay patterns.

7. The semiconductor device of claim 6, further comprising:

third upper overlay patterns disposed over the extended portions of the first upper overlay patterns;

fourth upper overlay patterns disposed over the extended portions of the second upper overlay patterns;

third via overlay patterns interposed between the extended portions of the first upper overlay patterns and the third upper overlay patterns, wherein a width in the second direction of each of the third via overlay patterns is smaller than a width in the first direction of each of the extended portions of the first upper overlay patterns; and fourth via overlay patterns interposed between the extended portions of the second upper overlay patterns and the fourth upper overlay patterns, wherein a width in the first direction of each of the fourth via overlay patterns is smaller than a width in the first direction of each of the extended portions of the second upper overlay patterns.

8. The semiconductor device of claim 1, wherein a plurality of second via overlay patterns of the second via overlay patterns is interposed between a single second lower overlay pattern of the second lower overlay patterns and a single second upper overlay pattern of the second upper overlay patterns, wherein the plurality of first via overlay patterns interposed between the single first lower overlay pattern and the single first upper overlay pattern are in contact with the single first lower overlay pattern and the single first upper overlay pattern, wherein respective interfaces are between the single first lower overlay pattern and the plurality of first via overlay patterns, and wherein the plurality of first via overlay patterns are integrally connected to the single first upper overlay pattern without interfaces between the single first upper overlay pattern and the plurality of first via overlay patterns.

9. The semiconductor device of claim 1, wherein the semiconductor substrate comprises a single shot area including a plurality of chip areas and a scribe lane area interposed between the plurality of chip areas, and a first overlay area including the first overlay group and the second overlay group is provided as a plurality of first overlay areas.

10. The semiconductor device of claim 9, further comprising a second overlay area disposed on the semiconductor substrate, wherein the second overlay area is disposed in the scribe lane area and has an area greater than an area of the first overlay area, and at least a portion of the plurality of first overlay areas is disposed in the plurality of chip areas.

11. The semiconductor device of claim 10, wherein a remainder of the plurality of first overlay areas other than the portion of the plurality of first overlay areas is disposed in the scribe lane area, and the plurality of first overlay areas disposed in the plurality of chip areas and the scribe lane area are arranged uniformly in a specific area.

12. The semiconductor device of claim 1, further comprising a circuit interconnection structure disposed on a circuit area of the semiconductor substrate, wherein the circuit interconnection structure comprises a lower circuit pattern, a circuit via pattern disposed on the lower circuit pattern, and an upper wiring disposed on the circuit via pattern, wherein the lower circuit pattern is disposed coplanar with the first lower overlay patterns and the second lower overlay patterns, and a width of the lower circuit pattern is smaller than the width of each of the first lower overlay patterns and the width of each of the second lower overlay patterns, wherein the circuit via pattern is disposed coplanar with the first via overlay patterns and the second via overlay patterns, and wherein the upper wiring is disposed coplanar with the first upper overlay patterns and the second upper overlay patterns, and a width of the upper wiring is smaller than the width of each of the first upper overlay patterns and the width of each of the second upper overlay patterns.

13. A semiconductor device, comprising:
a first overlay group disposed on a semiconductor substrate; and
a second overlay group disposed on the semiconductor substrate, adjacent to and spaced apart from the first overlay group,
wherein the first overlay group comprises first lower overlay patterns, first upper overlay patterns overlapping the first lower overlay patterns, and first via overlay patterns interposed between the first lower overlay patterns and the first upper overlay patterns,
wherein the second overlay group comprises second lower overlay patterns, second upper overlay patterns overlapping the second lower overlay patterns, and second via overlay patterns interposed between the second lower overlay patterns and the second upper overlay patterns,
wherein each of the first lower overlay patterns and the first upper overlay patterns extend in a first direction,
wherein each of the second lower overlay patterns and the second upper overlay patterns extend in a second direction perpendicular to the first direction,
wherein a width in the second direction of each of the first upper overlay patterns is greater than a width in the second direction of each of the first lower overlay patterns,
wherein a width in the first direction of each of the second upper overlay patterns is greater than a width in the first direction of each of the second lower overlay patterns,
wherein a plurality of first via overlay patterns of the first via overlay patterns is interposed between a single first lower overlay pattern of the first lower overlay patterns and a single first upper overlay pattern of the first upper overlay patterns, and
wherein a plurality of second via overlay patterns of the second via overlay patterns is interposed between a single second lower overlay pattern of the second lower overlay patterns and a single second upper overlay pattern of the second upper overlay patterns.

14. The semiconductor device of claim 13, wherein the second lower overlay patterns have end portions disposed to be adjacent to and spaced apart from the first overlay group,
wherein the first lower overlay patterns are disposed spaced apart from each other by a first distance, each of the first lower overlay patterns has a first width in the second direction, and a distance between a side surface of a first lower overlay pattern from among the first lower overlay patterns disposed most adjacent to the second lower overlay patterns and the end portions in the first direction of the second lower overlay patterns is greater than a sum of the first distance and the first width, and
wherein the first width of each of the first lower overlay patterns is less than the first distance between the first lower overlay patterns.

15. The semiconductor device of claim 13, wherein the first upper overlay patterns comprise extended portions which extend in the first direction from portions of the first upper overlay patterns overlapped with the first lower overlay patterns, and
the second upper overlay patterns comprise extended portions which extend in the second direction from portions of the second upper overlay patterns overlapped with the second lower overlay patterns.

16. The semiconductor device of claim 15, further comprising:
third upper overlay patterns disposed over the extended portions of the first upper overlay patterns;
fourth upper overlay patterns disposed over the extended portions of the second upper overlay patterns;
third via overlay patterns interposed between the extended portions of the first upper overlay patterns and the third upper overlay patterns, wherein a width in the second direction of each of the third via overlay patterns is smaller than a width in the second direction of each of the extended portions of the first upper overlay patterns; and
fourth via overlay patterns interposed between the extended portions of the second upper overlay patterns and the fourth upper overlay patterns, wherein a width in the first direction of each of the fourth via overlay patterns is smaller than a width in the first direction of each of the extended portions of the second upper overlay patterns.

17. The semiconductor device of claim 1, wherein the first lower overlay patterns have substantially a same size and shape in plan view,
wherein the first via overlay patterns have substantially a same size and shape in plan view,
wherein the first upper overlay patterns have substantially a same size and shape in plan view,
wherein the second lower overlay patterns have substantially a same size and shape in plan view,
wherein the second via overlay patterns have substantially a same size and shape in plan view, and
wherein the second upper overlay patterns have substantially a same size and shape in plan view.

18. The semiconductor device of claim 13, wherein the first lower overlay patterns are substantially parallel with each other,
wherein the second lower overlay patterns are substantially parallel with each other,
wherein each of the first lower overlay patterns has an extended line shape in the first direction,
wherein each of the second lower overlay patterns has an extended line shape in the second direction,
wherein the first lower overlay patterns have substantially a same size and shape in plan view, and
wherein the second lower overlay patterns have substantially a same size and shape in plan view.

19. A semiconductor device, comprising:
a first overlay group disposed on a semiconductor substrate; and
a second overlay group disposed on the semiconductor substrate, adjacent to and spaced apart from the first overlay group,
wherein the first overlay group comprises first lower overlay patterns, first upper overlay patterns overlapping the first lower overlay patterns, and first via overlay patterns interposed between the first lower overlay patterns and the first upper overlay patterns,
wherein the second overlay group comprises second lower overlay patterns, second upper overlay patterns overlapping the second lower overlay patterns, and second via overlay patterns interposed between the second lower overlay patterns and the second upper overlay patterns,
wherein the first lower overlay patterns and the first upper overlay patterns extend in a first direction, wherein the second lower overlay patterns and the second upper overlay patterns extend in a second direction perpendicular to the first direction, wherein a width in a second direction of each of the first upper overlay patterns is different from a width in the second direction of each of the first lower overlay patterns, wherein a width in the first direction of each of the second upper overlay patterns is different from a width in the first direction of each of the second lower overlay patterns, wherein a plurality of first via overlay patterns of the first via overlay patterns is interposed between a single first lower overlay pattern of the first lower overlay patterns and a single first upper overlay pattern of the first upper overlay patterns, wherein a plurality of second via overlay patterns of the second via overlay patterns is interposed between a single second lower overlay pattern of the second lower overlay patterns and a single second upper overlay pattern of the second upper overlay patterns, wherein the first lower overlay patterns have substantially a same size and shape in plan view, wherein the first via overlay patterns have substantially a same size and shape in plan view, wherein the first upper overlay patterns have substantially a same size and shape in plan view, wherein the second lower overlay patterns have substantially a same size and shape in plan view, wherein the second via overlay patterns have substantially a same size and shape in plan view, and wherein the second upper overlay patterns have substantially a same size and shape in plan view.

* * * * *